(12) United States Patent
Limberg

(10) Patent No.: US 8,284,832 B2
(45) Date of Patent: Oct. 9, 2012

(54) SYSTEM FOR DIGITAL TELEVISION BROADCASTING USING MODIFIED 2/3 TRELLIS CODING

(75) Inventor: Allen LeRoy Limberg, Port Charlotte, FL (US)

(73) Assignee: Samsung Electronics Co., Ltd., Suwon-si (KR)

( * ) Notice: Subject to any disclaimer, the term of this patent is extended or adjusted under 35 U.S.C. 154(b) by 604 days.

(21) Appl. No.: 12/492,762

(22) Filed: Jun. 26, 2009

(65) Prior Publication Data
US 2009/0323823 A1 Dec. 31, 2009

Related U.S. Application Data

(60) Provisional application No. 61/133,294, filed on Jun. 27, 2008.

(51) Int. Cl.
*H04N 11/04* (2006.01)
*H04N 11/02* (2006.01)
*H04N 7/12* (2006.01)

(52) U.S. Cl. ........................................ 375/240; 375/265
(58) Field of Classification Search .................. 375/265, 375/240
See application file for complete search history.

(56) References Cited

U.S. PATENT DOCUMENTS

| | | | |
|---|---|---|---|
| 2,632,058 A | 11/1947 | Gray | |
| 4,622,670 A | 11/1986 | Martin | |
| 4,975,698 A | 12/1990 | Kagey | |
| 5,825,832 A | 10/1998 | Benedetto | |
| 6,313,885 B1 * | 11/2001 | Patel et al. | 348/725 |
| 6,353,911 B1 | 3/2002 | Brink | |
| RE38,513 E * | 5/2004 | Oshima | 386/356 |
| 7,383,493 B2 | 6/2008 | Shen et al. | |
| 2009/0322961 A1* | 12/2009 | Limberg | 348/725 |

OTHER PUBLICATIONS

NPL_Performance of Staggered Quadrature Amplitude—1975.*
NPL_Comparison of Terrestrial DTV Transmission systems—2000.*
NPL_Blind Decision Feedback Equalization for TV receivers—1998.*
"DSP Trick: Binary / Gray Code Conversion" www.dspguru.cpm/comp.dsp/tricks/alg/grayconv.htm. accessed Jul. 28, 2009, pp. 1-2.

* cited by examiner

*Primary Examiner* — William C Vaughn, Jr.
*Assistant Examiner* — Luis M. Perez Fuentes
(74) *Attorney, Agent, or Firm* — Sughrue Mion, PLLC

(57) ABSTRACT

The outer convolutional coding of the signals used to transmit mobile-handheld (M/H) service data within digital-television (DTV) signals is subjected to anti-Gray coding, either before or after its interleaving, but before its inner convolutional coding. In a receiver for such M/H-service data, portions of the trellis decoded DTV signal containing soft decisions concerning symbol-interleaved convolutionally coded M/H-service data are recoded for a Gray-code mapping of symbols to modulation levels. This is done either before or after symbol de-interleaving, but before decoding the outer convolutional coding. Soft decisions concerning extrinsic information to be fed back to the ⅔ trellis decoder to close a turbo decoding loop are derived from soft decisions as to the M/H-service data, which derivation includes re-coding for a binary-code mapping of symbols to modulation levels. Each re-coding procedure can be performed using ROM, but preferably is performed using simple digital logic.

36 Claims, 23 Drawing Sheets

| RECODING TABLE 1 | |
|---|---|
| ORIGINAL SYMBOL | TRANSMITTED SYMBOL |
| 00 | 00 |
| 01 | 01 |
| 11 | 10 |
| 10 | 11 |

Fig. 2

| RECODING TABLE 2 | |
|---|---|
| ORIGINAL SYMBOL | TRANSMITTED SYMBOL |
| 01 | 00 |
| 00 | 01 |
| 10 | 10 |
| 11 | 11 |

Fig. 3

| RECODING TABLE 3 | |
|---|---|
| ORIGINAL SYMBOL | TRANSMITTED SYMBOL |
| 00 | 00 |
| 10 | 01 |
| 11 | 10 |
| 01 | 11 |

Fig. 4

| RECODING TABLE 4 | |
|---|---|
| ORIGINAL SYMBOL | TRANSMITTED SYMBOL |
| 10 | 00 |
| 00 | 01 |
| 01 | 10 |
| 11 | 11 |

Fig. 5

| RECODING TABLE 5 ||
|---|---|
| ORIGINAL SYMBOL | TRANSMITTED SYMBOL |
| 11 | 00 |
| 10 | 01 |
| 00 | 10 |
| 01 | 11 |

Fig. 6

| RECODING TABLE 6 ||
|---|---|
| ORIGINAL SYMBOL | TRANSMITTED SYMBOL |
| 10 | 00 |
| 11 | 01 |
| 01 | 10 |
| 00 | 11 |

Fig. 7

| RECODING TABLE 7 ||
|---|---|
| ORIGINAL SYMBOL | TRANSMITTED SYMBOL |
| 11 | 00 |
| 01 | 01 |
| 00 | 10 |
| 10 | 11 |

Fig. 8

| RECODING TABLE 8 ||
|---|---|
| ORIGINAL SYMBOL | TRANSMITTED SYMBOL |
| 01 | 00 |
| 11 | 01 |
| 10 | 10 |
| 00 | 11 |

Fig. 9

| MSB SOFT DECISION TO ROM | LSB SOFT DECISION TO ROM | MSB SOFT DECISION FROM ROM | LSB SOFT DECISION FROM ROM | | MSB SOFT DECISION TO ROM | LSB SOFT DECISION TO ROM | MSB SOFT DECISION FROM ROM | LSB SOFT DECISION FROM ROM |
|---|---|---|---|---|---|---|---|---|
| 0 00 | 0 00 | 0 00 | 0 00 | | 0 10 | 0 00 | 0 10 | 0 00 |
| 0 00 | 0 01 | 0 00 | 0 01 | | 0 10 | 0 01 | 0 10 | 0 01 |
| 0 00 | 0 10 | 0 00 | 0 10 | | 0 10 | 0 10 | 0 10 | 0 10 |
| 0 00 | 0 11 | 0 00 | 0 11 | | 0 10 | 0 11 | 0 10 | 0 11 |
| 0 00 | 1 00 | 0 00 | 1 00 | | 0 10 | 1 00 | 0 10 | 1 00 |
| 0 00 | 1 01 | 0 00 | 1 01 | | 0 10 | 1 01 | 0 10 | 1 01 |
| 0 00 | 1 10 | 0 00 | 1 10 | | 0 10 | 1 11 | 0 10 | 1 11 |
| 0 01 | 0 00 | 0 01 | 0 00 | | 0 11 | 0 00 | 0 11 | 0 00 |
| 0 01 | 0 10 | 0 01 | 0 10 | | 0 11 | 0 10 | 0 11 | 0 10 |
| 0 01 | 0 11 | 0 01 | 1 00 | | 0 11 | 1 00 | 0 11 | 1 00 |
| 0 01 | 1 01 | 0 01 | 1 01 | | 0 11 | 1 01 | 0 11 | 1 01 |
| 0 01 | 1 10 | 0 01 | 1 10 | | 0 11 | 1 10 | 0 11 | 1 10 |
| 0 01 | 1 11 | 0 01 | 1 11 | | 0 11 | 1 11 | 0 11 | 1 11 |

Fig. 27A  Tables of Illustrative Contents of Recoder ROM

| MSB SOFT DECISION TO ROM | LSB SOFT DECISION TO ROM | MSB SOFT DECISION FROM ROM | LSB SOFT DECISION FROM ROM |
|---|---|---|---|
| 1 00 | 0 00 | 1 00 | 1 11 |
| 1 00 | 0 01 | 1 00 | 1 10 |
| 1 00 | 0 10 | 1 00 | 1 01 |
| 1 00 | 0 11 | 1 00 | 1 00 |
| 1 00 | 1 00 | 1 00 | 0 11 |
| 1 00 | 1 01 | 1 00 | 0 10 |
| 1 00 | 1 10 | 1 00 | 0 01 |
| 1 00 | 1 11 | 1 00 | 0 00 |
| 1 01 | 0 00 | 1 01 | 1 11 |
| 1 01 | 0 01 | 1 01 | 1 10 |
| 1 01 | 0 10 | 1 01 | 1 01 |
| 1 01 | 0 11 | 1 01 | 1 00 |
| 1 01 | 1 00 | 1 01 | 0 11 |
| 1 01 | 1 01 | 1 01 | 0 10 |
| 1 01 | 1 10 | 1 01 | 0 01 |
| 1 01 | 1 11 | 1 01 | 0 00 |

| MSB SOFT DECISION TO ROM | LSB SOFT DECISION TO ROM | MSB SOFT DECISION FROM ROM | LSB SOFT DECISION FROM ROM |
|---|---|---|---|
| 1 10 | 0 00 | 1 10 | 1 11 |
| 1 10 | 0 01 | 1 10 | 1 10 |
| 1 10 | 0 10 | 1 10 | 1 01 |
| 1 10 | 0 11 | 1 10 | 1 00 |
| 1 10 | 1 00 | 1 10 | 0 11 |
| 1 10 | 1 01 | 1 10 | 0 10 |
| 1 10 | 1 10 | 1 10 | 0 01 |
| 1 11 | 0 00 | 1 11 | 1 00 |
| 1 11 | 0 01 | 1 11 | 1 10 |
| 1 11 | 0 10 | 1 11 | 1 01 |
| 1 11 | 0 11 | 1 11 | 1 00 |
| 1 11 | 1 00 | 1 11 | 0 11 |
| 1 11 | 1 01 | 1 11 | 0 10 |
| 1 11 | 1 10 | 1 11 | 0 01 |
| 1 11 | 1 11 | 1 11 | 0 00 |

Fig. 27B Tables of Illustrative Contents of Recoder ROM

SYSTEM FOR DIGITAL TELEVISION BROADCASTING USING MODIFIED 2/3 TRELLIS CODING

CROSS-REFERENCE TO RELATED APPLICATION

This application claims priority from U.S. Provisional Patent Application Ser. No. 61/133,294 filed on Jun. 27, 2008, the disclosures of which are incorporated herein in their entirety by reference.

BACKGROUND OF THE INVENTION

Apparatuses consistent with the present invention relate to over-the-air broadcasting of digital television (DTV) signals, and more particularly, to receivers for such broadcast DTV signals.

The Advanced Television Systems Committee (ATSC) published a Digital Television Standard in 1995 as Document A/53, hereinafter referred to simply as "A/53" for sake of brevity Digital television. A/53 specifies the eight-level-modulation vestigial-sideband amplitude-modulation signals known as "8VSB" signals that are used for over-the-air DTV broadcasting in the United States of America. In late May 2009 ATSC completed the writing of a "Candidate Standard: ATSC Mobile DTV Standard", referred to hereinafter simply as "A/153" for sake of brevity, which candidate standard is incorporated herein by reference.

A/153 is directed to transmitting ancillary signals in time division multiplex with 8VSB DTV signals, which mobile/handheld (M/H)-service signals are designed for reception by mobile receivers and by hand-held receivers. The M/H-service data referred to as "M/H-service data" employ internet protocol (IP) transport streams. The M/H-service data are randomized and subjected to transverse Reed-Solomon (TRS) forward-error-correction (FEC) coding before serially concatenated convolutional coding (SCCC). The SCCC incorporates the 12-phase ⅔ trellis coding of 8VSB as inner convolutional coding following single-phase outer convolutional coding and intermediate symbol-interleaving procedures. The symbol-interleaved outer convolutional coding is time-division multiplexed into 8VSB DTV signal so as not to be subject to the convolutional byte interleaving prescribed by Section 4.2.5 of Annex D of A/53 and applied to the main DTV signal.

The 8-level symbol mapping specified in A/53 and in A/153 maps each group of $Z_2$, $Z_1$ and $Z_0$ bits into a respective eight-level VSB symbol in accordance with simple binary coding. This results in the $Z_2$ and $Z_2$ bits of original data both changing value between the 011 and 100 levels. This makes a double-bit error likely when noise causes an adjacent-bin error during data slicing in this region of the symbol map. Only Reed-Solomon coding with 8-bit bytes is concatenated after the ⅔ trellis coding in ordinary 8VSB transmissions as specified by A/53, so the double-bit errors being within single bytes affect overall coding being found correct no more than single-bit errors within single bytes. However, when further convolutional coding is introduced before the ⅔ trellis coding at the transmitter, the double-bit errors are more disruptive than single-bit errors when decoding that further convolutional coding in the receiver.

Digital transmission systems using multi-level symbols generated by Gray coding are known. An adjacent-bin error will cause only a single-bit error in an 8-level symbol using Gray code symbol mapping, rather than a double-bit or triple-bit error. However, symbol mapping using Gray code over all eight modulation levels is incompatible with the ⅔ trellis coding of ordinary 8VSB coding. The ⅔ trellis coding must be maintained so as not to disrupt the operations of receivers already in the field that were designed for receiving ordinary 8VSB signals broadcast per A/53. So, initially, the inventor was unable to discern how to utilize effectively the general idea of avoiding an adjacent-bin error during data slicing generating double-bit errors in a special type of turbo coding designed for digital television broadcasting.

After further consideration, the inventor was able to figure out how to avoid generating double-bit errors in symbols each composed of a Z-sub-2 bit and a Z-sub-1 bit, which errors arise from adjacent-bin errors during data slicing. Each 2-bit symbol composed of a Z-sub-2 bit and a Z-sub-1 bit could be anti-Gray coded before ⅔ trellis coding in the DTV transmitter. Then, subsequent to ⅔ trellis decoding in the DTV receiver, each 2-bit symbol could be Gray coded to counter the effects of the anti-Gray coding. The symbol mapping into modulation levels is converted to Gray coding insofar as the two more significant bits of the 3-bit symbols are concerned. This procedure extends the effects of the ⅔ trellis decoding from just the Z-sub-1 bits to the Z-sub-2 bits as well, in a unique way quite different from the prior art.

U.S. Pat. No. 5,825,832 issued 20 Oct. 1998 to V. Benedetto and titled "Method and device for the reception of signals affected by inter-symbol interface" describes decoding procedures for serially concatenated convolutional coding (SCCC) that use cascaded Viterbi decoders, but do not employ a turbo decoding loop. A first Viterbi decoder supplies hard decisions as to the transmitted symbols accompanied by a reliability parameter. This soft-decision output from the first Viterbi decoder, which is essentially intended to take into account the memory effects of the channel by counteracting the effects of inter-symbol interference, is fed after de-interleaving to a second Viterbi decoder which carries out the actual decision. This decoding operation corresponds to the open-loop operation of a turbo decoding loop for SCCC. Interestingly, using single-dimension symbol mapping defined according to consecutive binary numbers will aid the first Viterbi decoder in its task of counteracting the effects of inter-symbol interference, since there are more transition points in the coded bits than there are using single-dimension symbol mapping defined according to Gray coding. The conversion of the symbol mapping after the first Viterbi decoder, so the second Viterbi decoder is presented with single-dimension symbol mapping defined according to Gray coding will benefit the second Viterbi decoder making actual decisions. This is because there are fewer transition points in the coded bits to affect decisions than with single-dimension symbol mapping defined according to consecutive binary numbers. Accordingly, there is apt to be a reduction in the number of decoding iterations required when turbo decoding procedures are implemented. Possibly, there will be some reduction in the SNR required to achieve satisfactory reception.

No matter what type of symbol mapping is used, the ⅔ trellis coding provides information for resolving adjacent-bin errors. When the corruption of the 8VSB symbols by noise is not severe, a DTV receiver will be able to decode the ⅔ trellis coding and correct adjacent-bin errors in the coded symbols, whether the errors be double-bit or single-bit in nature. When a spike of noise energy or a drop-out in received signal obliterates a few 8VSB symbols or causes distant-bin errors in the coded symbols, the information for resolving adjacent-bin errors in subsequent symbols is corrupted and is apt to generate recurring error for some time. The code pattern will probably eventually be such that the error would self correct. Similar effects occur for the convolutional outer coding.

In some DTV receiver designs, in order to shorten the time to recover from a spike of noise energy or a drop-out in received signal, the results of data-slicing 8VSB symbols are used to start the ⅔ trellis decoding procedure over. Gray coding the hard-decision portions of the results of data-slicing 8VSB symbols, as expressed in the soft decisions from the decoder for the inner convolutional coding, benefits the decoder for the outer convolutional coding. This is because the probability of error in the least significant bit of the symbol extracted from data slicing is reduced by at least one third.

There has been considerable development work done in DTV receiver design that incorporates the Viterbi decoder for the ⅔ trellis coding of ordinary 8VSB coding into the adaptive channel equalization filtering used to counteract the effects of inter-symbol interference. Deferring single-dimension symbol mapping being defined according to Gray coding until after both adaptive channel equalization and the Viterbi decoding procedure used to implement the adaptive channel equalization preserves the benefits of that previous development work.

After the inventor's insight into how to avoid an adjacent-bin error during data slicing generating double-bit errors in symbols each composed of a Z-sub-2 bit and a Z-sub-1 bit, there remained further problems of designing DTV transmitter and DTV receiver configurations to exploit the insight. U.S. patent application Ser. No. 11/978,462 titled "System for digital television broadcasting using modified ⅔ trellis coding" and filed by A. L. R. Limberg on 29 Oct. 2007 was published 15 May 2008 with publication No. US-2008-0112502-A1. The DTV receiver designs described in application Ser. No. 11/978,462 re-code soft decisions from the ⅔ trellis decoder to generate interleaved outer coding for subsequent de-interleaving and decoding. This re-coding is described as being performed by read-only memory (ROM) addressed by two-bit symbols. The inventor subsequently found that this symbol re-coding is better performed by ROM addressed by each successive complete soft decision supplied by the ⅔ trellis decoder. The DTV receiver designs described in application Ser. No. 11/978,462 re-code soft decisions from the outer SISO decoder for subsequent derivation of extrinsic information fed back to the ⅔ trellis decoder to implement turbo decoding. This symbol re-coding is also described as being performed by read-only memory addressed by two-bit symbols. The inventor subsequently found that this symbol re-coding also is better performed by ROM addressed by each successive complete soft decision supplied by the outer SISO decoder. That is, the ROMs used for symbol re-coding need to be addressed by the several bits descriptive of the two soft bits in each soft decision they are to re-code.

The ROMs used for symbol re-coding become quite large when addressed by the several bits descriptive of the two soft bits in each soft decision they are to re-code. E.g., addressing can be sixteen bits wide. However, the inventor has subsequently discerned that simple logic circuitry can be used for re-coding symbols from a mapping for binary-code modulation to a mapping for reflected-binary-code modulation—i.e., for Gray-code modulation—or vice versa. Symbol re-coders using such simple logic circuitry are used in receivers that embody the invention in its preferred forms.

SUMMARY OF THE INVENTION

Serially concatenated convolutional code (SCCC) signals are used to transmit M/H-service data within DTV signals using SCCC that incorporates the ⅔ trellis coding used for all DTV signals as inner convolutional coding for the SCCC. The SCCC'd M/H-service data are transmitted so as to be free of convolutional byte interleaving prescribed by Section 4.2.5 of Annex D of A/53. The outer convolutional coding of the SCCC is subjected to anti-Gray coding, either before or after its interleaving, but before its inner convolutional coding. The invention is directed towards receivers for M/H-service data as so transmitted. In such a receiver portions of the trellis decoded DTV signal containing soft decisions as to the symbol-interleaved convolutionally coded M/H-service data are re-coded for a Gray-code mapping of symbols to modulation levels. This symbol re-coding is done either before or after symbol de-interleaving, but is done before decoding the outer convolutional coding to recover M/H-service data.

In preferred receiver designs soft decisions concerning extrinsic information fed back to the ⅔ trellis decoder to close a turbo decoding loop are derived from soft decisions as to the M/H-service data. Such derivation, as performed in accordance with aspects of the invention, includes re-coding that causes soft decisions concerning extrinsic information to conform to a binary-code mapping of symbols to modulation levels.

In some receiver designs that embody the invention, each symbol re-coding procedure is performed using read-only memory. However, in receivers that embody the invention in preferred forms, each symbol re-coding procedure is performed using simple logic circuitry.

BRIEF DESCRIPTION OF THE DRAWINGS

FIGS. 2 through 9 are tables of different forms of symbol re-coding that are used in respective embodiments of the DTV transmitter apparatuses of FIGS. 1 and 10, according to exemplary embodiments of the present application.

FIGS. 27A and 27B are tables showing illustrative contents of read-only memory used for re-coding symbols from binary-code mapping to Gray-code mapping, or vice versa, according to exemplary embodiments of the present application.

Figure 28:
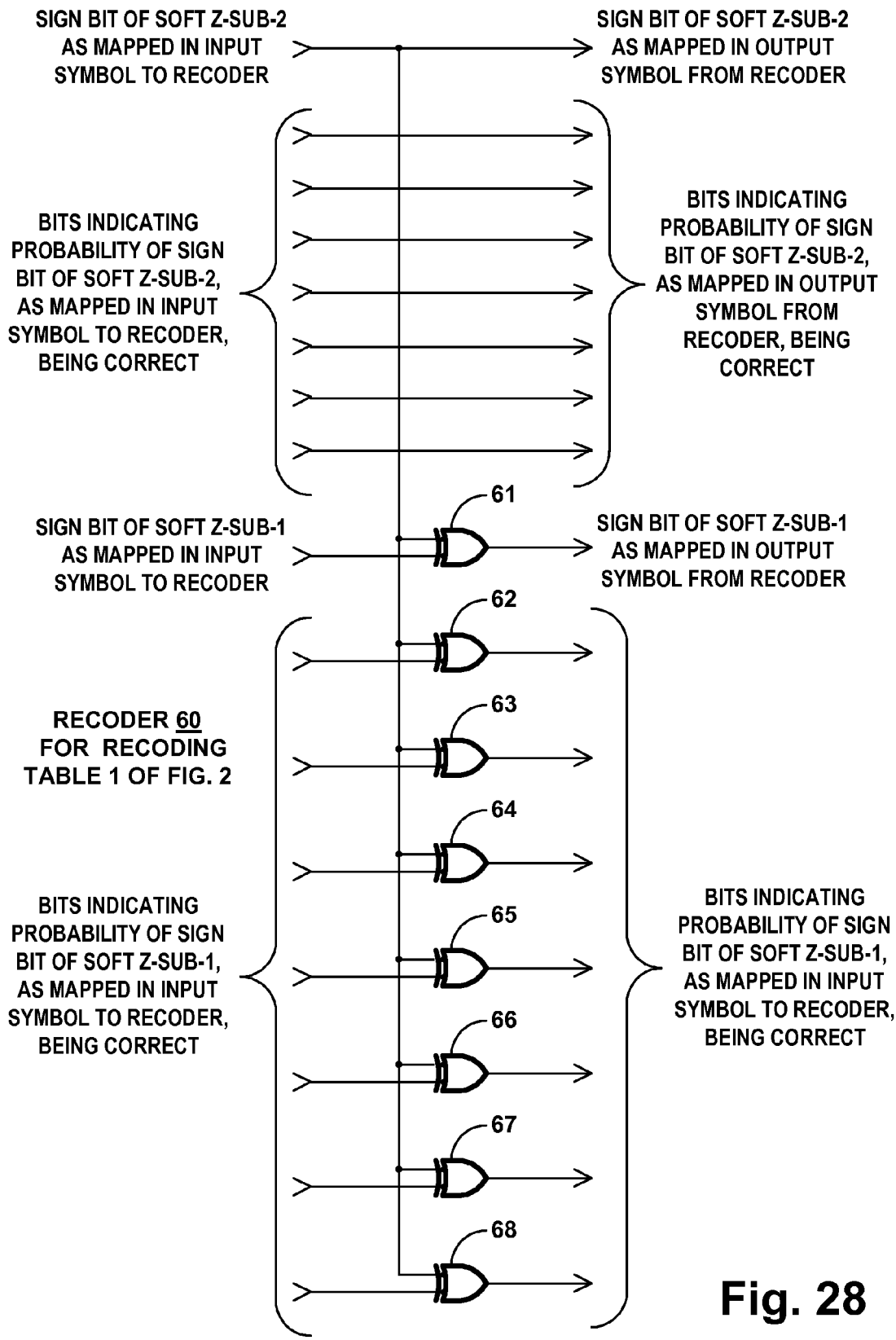
Figure 29:
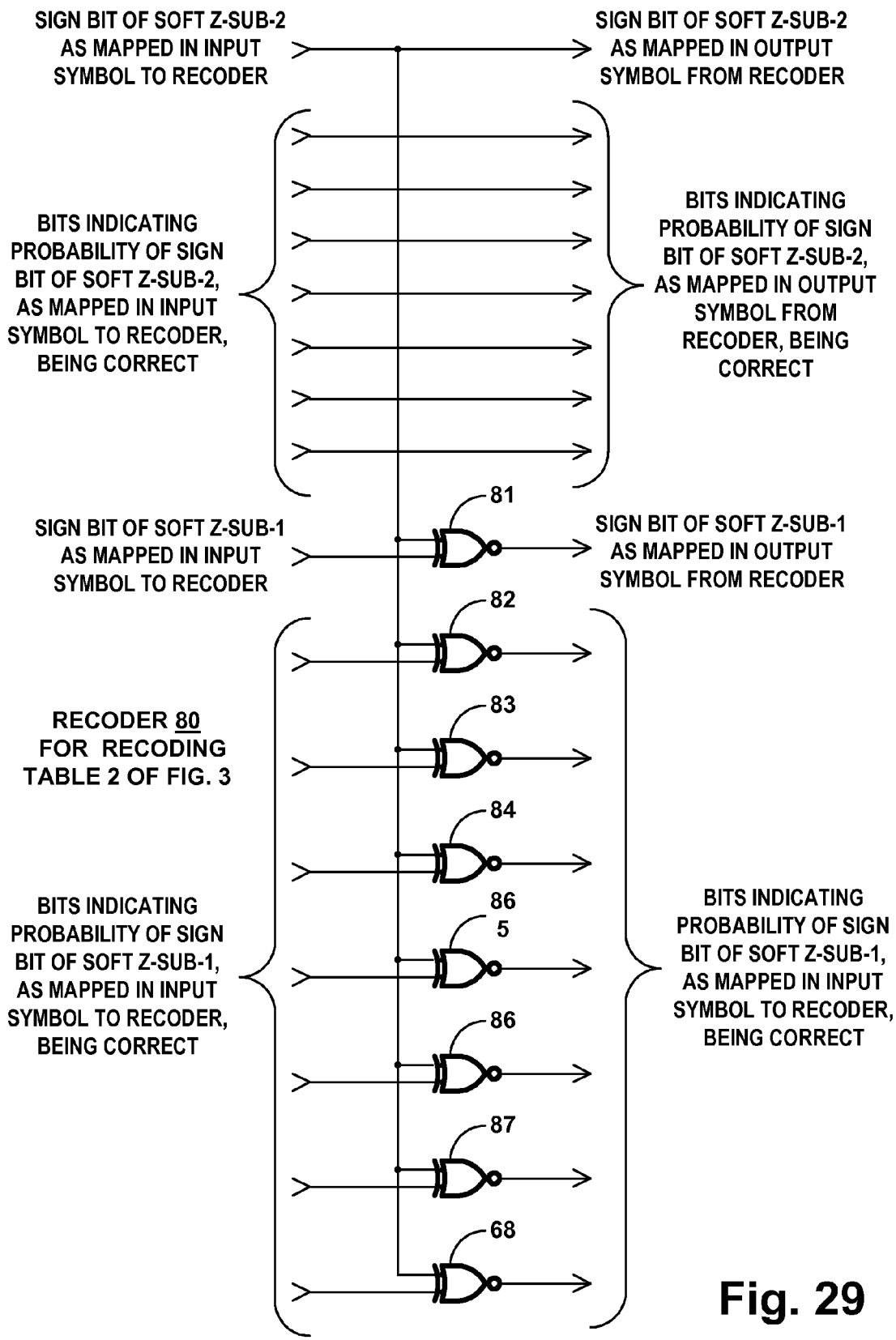

Each of FIGS. 28 and 29 is a schematic diagram of a respective symbol re-coder that uses simple logic circuitry for re-coding symbols from binary-code mapping to Gray-code mapping, or vice versa, according to exemplary embodiments of the present application.

DETAILED DESCRIPTION OF EXEMPLARY EMBODIMENTS

A/153 provides broadcasting services for mobile/handheld (M/H) receivers using a portion of the 19.39 Mbps ATSC 8-VSB transmission, while the remainder is still available for high-definition or multiple standard-definition television services. The system is a dual-stream system: the ATSC service multiplex for existing digital television services and an M/H-service multiplex for one or more mobile and hand-held services.

Figure 1:
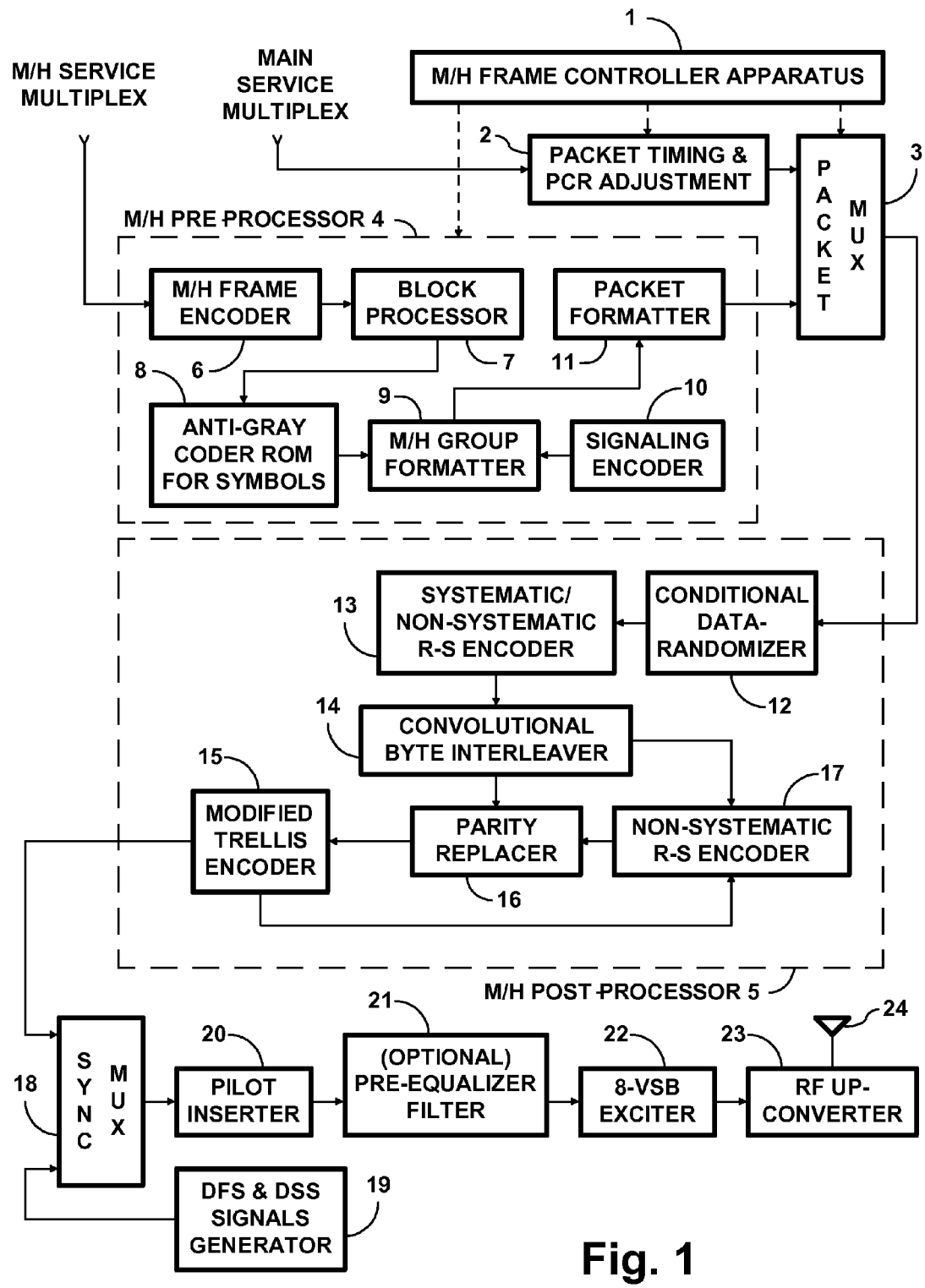
FIG. 1 is a schematic diagram of transmitter apparatus for broadcast digital television (DTV) signals using serially concatenated convolutional coding (SCCC) of M/H type, which transmitter apparatus is modified in accordance with an aspect of the invention for anti-Gray coding the interleaved outer convolutional coding portion of the SCCC, according to an exemplary embodiment of the present application.

FIG. 1 shows transmitter apparatus for broadcast DTV signals using SCCC of the type prescribed by A/153. The transmitter apparatus receives two sets of input streams: one consists of the MPEG transport stream (TS) packets of the main-service data and the other consists of the M/H-service data. Before being emitted from the transmitter, the M/H-service data are encapsulated in special MPEG transport packets called "M/H-encapsulating TS packets" or "MHE packets" for short. This is done to avoid disruption of the reception of the main-service data for legacy 8-VSB receivers. M/H-service data can be conveyed in MPEG transport streams, such as MPEG-2 video/audio or MPEG-4 video/audio, or can be conveyed by internet-protocol (IP) packets. The choice of service types can be made in preceding portions of the transmission system that are not described in detail in this specification. A primary function of the FIG. 1 transmitter apparatus is to combine these two types of streams into one stream of MPEG TS packets and to process the combined streams for transmission as an ATSC trellis-coded 8-VSB signal.

M/H Frame controller apparatus 1 controls these procedures. The main-service multiplex stream of data is supplied to packet-timing and PCR-adjustment circuitry 2 before the packets of that stream are routed to a packet multiplexer 3 to be time-division multiplexed with packets encapsulating M/H-service data. Because of their time-division multiplexing with the packets encapsulating M/H data, changes have to be made to the time of emission of the main-service stream packets compared to the timing that would occur with no M/H stream present. The packet-timing and PCR-adjustment circuitry 2 makes these timing changes responsive to control signals supplied thereto from the M/H Frame controller apparatus 1. The packet multiplexer 3 time-division multiplexes the main-service stream packets with packets encapsulating M/H-service data, as directed by control signals from the M/H Frame controller apparatus 1. The operations of the M/H transmission system on the M/H-service data are divided into two stages: the M/H pre-processor 4 and the M/H post-processor 5.

The function of the pre-processor 4 is to rearrange the M/H-service data into an M/H data structure, to enhance the robustness of the M/H-service data by additional FEC processes, to insert training sequences, and subsequently to encapsulate the processed enhanced data into MPEG null TS packets. The operations performed by the pre-processor 4 include M/H Frame encoding, block processing, group formatting, packet formatting and M/H signaling encoding. The M/H Frame controller apparatus 1 provides the necessary transmission parameters to the pre-processor 4 and controls the multiplexing of the main-service data packets and the M/H-service data packets by the packet multiplexer 3 to organize the M/H Frame.

The function of the post-processor 5 is to process the main-service data by normal 8-VSB encoding and to manipulate the pre-processed M/H-service data in the combined stream to ensure backward compatibility with ATSC 8-VSB. Main-service data in the combined stream are processed exactly the same way as for normal 8-VSB transmission: randomizing, RS encoding, interleaving and trellis encoding. The M/H-service data in the combined stream are processed differently from the main-service data, with the pre-processed M/H-service data bypassing data randomization. The pre-processed M/H-service data is subjected to non-systematic RS encoding. Additional operations are done on the pre-processed M/H-service data to initialize the trellis encoder memories at the beginning of each training sequence included in the pre-processed M/H-service data. The non-systematic RS encoding allows the insertion of the regularly spaced long training sequences without disturbing legacy receivers.

More specifically, the M/H-service multiplex stream of data is supplied to the M/H pre-processor 4 for processing and subsequent encapsulation in the payload fields of MPEG transport packets with special headers identifying them as M/H-encapsulating packets. These transport packets, commonly referred to as "MHE packets", are supplied to the packet multiplexer 3 after data encapsulation within their payload fields is completed.

Still more specifically, the M/H-service multiplex stream of data is supplied to an M/H Frame encoder 6 which provides transverse Reed-Solomon (TRS) coding of data packets. The data packets are also subjected to periodic cyclic redundancy check (CRC) coding to locate byte errors for the TRS coding. Each M/H Frame is composed of one or two frames of the TRS coding, and the data in each frame of the TRS-CRC coding are randomized independently from each other and from the data of the main-service multiplex. The M/H Frame encoder 6 is connected for supplying packets of M/H-service data and packets of TRS parity bytes within consecutive blocks of the TRS-CRC two-dimensional coding to a block processor 7, as input signal thereto. The block processor 7 includes encoders for each type of single-phase outer convolutional coding used in the SCCC and subsequent interleaving to generate successive 2-bit symbols of each type of single-phase outer convolutional coding. A read-only memory 8 is connected for receiving the interleaved outer convolutional coding from the block processor 7 as input addressing signal.

In accordance with an aspect of the invention, the ROM 8 responds to the interleaved outer convolutional coding from the block processor 7 with anti-Gray coding of consecutive, contiguous 2-bit symbols thereof. This anti-Gray coding is done in accordance with one of the different forms of re-coding shown in the tables of FIGS. 2 through 9. The preferred form of re-coding is that shown in FIG. 2.

The ROM 8 is connected to supply each successive block of anti-Gray-coded interleaved outer convolutional coding to a group formatter 9. The group formatter 9 includes an interleaved group format organizer that operates on the group format as it will appear after the ATSC data interleaver. It maps the FEC coded M/H-service data from the block processor into the corresponding M/H blocks of a group; adds pre-determined training data bytes and data bytes to be used for initializing the trellis encoder memories; and inserts place-holder bytes for main-service data, MPEG-2 header and non-systematic RS parity. The interleaved group format organizer also adds some dummy bytes to construct the intended group format. The interleaved group format organizer assembles a group of 118 consecutive TS packets. Some of these TS packets are composed of the anti-Gray-coded interleaved outer convolutional coding read from the ROM 8. Others of these TS packets are prescribed training signals stored in read-only memory within the group formatter 9 and inserted at prescribed intervals within the group. Still others of these TS packets are generated by a signaling encoder 10.

The M/H transmission system has two kinds of signaling channels generated by the signaling encoder 10. One is the Transmission Parameter Channel (TPC), and the other is the Fast Information Channel (FIC). The TPC is for signaling the M/H transmission parameters such as various FEC modes and M/H Frame information. The FIC is provided to enable the fast service acquisition of receivers and it contains cross layer information between the physical layer of receivers and their upper layer(s).

The interleaved group format organizer is followed in cascade connection by a byte de-interleaver within the group formatter 9. This byte de-interleaver complements the ATSC convolutional byte interleaver. The group formatter 9 is connected for supplying the response of this de-interleaver as its output signal, which is applied as input signal to a packet formatter 11. Initially, the packet formatter 11 expunges the main-service data place holders and the RS parity place holders that were inserted by the interleaved Group format organizer for proper operation of the byte de-interleaver in the group formatter 9. Subsequently, the packet formatter 11 replaces the 3-byte MPEG header place holder with an MPEG header having an MHE packet PID and inserts an MPEG TS sync byte before each 187-byte data packet as a prefix thereof. The packet formatter 11 supplies 118 MHE TS packets per group to the packet multiplexer 3, which time-division multiplexes these M/H-service TS packets with the main-service TS packets to construct M/H Frames.

The M/H Frame controller apparatus 1 controls the packet multiplexer 3 in the following way when the packet multiplexer schedules the 118 M/H-service TS packets from the packet formatter 11. Thirty-seven MHE packets immediately precede a DFS segment in a 313-segment VSB field of data, and another eighty-one MHE packets immediately succeed that DFS segment. The packet multiplexer 3 reproduces next-in-line main-service TS packets in place of MPEG null packets that contain place-holder bytes for main-service data in their payload fields. The packet multiplexer 3 is connected to supply the TS packets it reproduces to the post-processor 5 as input signal thereto.

More specifically, the packet multiplexer 3 is connected to apply the TS packets it reproduces to a conditional data randomizer 12 as the input signal thereto. The conditional data randomizer 12 suppresses the sync bytes of the 188-byte TS packets and randomizes the remaining data in accordance with conventional 8VSB practice, but only on condition that it is not encapsulated M/H-service data. The encapsulated M/H-service data bypass data randomization. The other remaining data are randomized per A/53, Annex D, §4.2.2.

An encoder 13 for systematic and non-systematic (207, 187) Reed-Solomon codes is connected to receive, as its input signal, the 187-byte packets that the conditional data randomizer 12 reproduces with conditional data randomization. The R-S parity generator polynomial and the primitive field generator for the Reed-Solomon encoder 13 are the same as those that A/53, Annex D, FIG. 5 prescribes for (207, 187) Reed-Solomon coding. When the R-S encoder 13 receives a main-service data packet, the R-S encoder 13 performs the systematic R-S coding process prescribed in A/53, Annex D, §4.2.3, appending the twenty bytes of R-S parity data to the conclusion of the 187-byte packet. When the R-S encoder 13 receives an M/H-service data packet, the RS encoder 13 performs a non-systematic RS encoding process. The twenty bytes of R-S parity data obtained from the non-systematic RS encoding process are inserted in a prescribed parity byte location within the MHE packet.

A convolutional byte interleaver 14 is connected for receiving as its input signal the 207-byte R-S codewords that the R-S encoder 13 generates. The byte interleaver 14 is generally of the type specified in A/53, Annex D, §4.2.4. The byte interleaver 14 is connected for supplying byte-interleaved 207-byte R-S codewords via a Reed-Solomon parity replacer 15 to a modified trellis encoder 16. The basic trellis encoding operation of the modified trellis encoder 16 is similar to that specified in A/53, Annex D, §4.2.4. The trellis encoder 16 converts the byte-unit data from the byte interleaver 14 to symbol units and performs a 12-phase trellis coding process per Section 6.4.1.4 Main Service Trellis Coding of A53-Part-2-2007. In order for the output data of the trellis encoder 16 to include pre-defined known training data, initialization of the memories in the trellis encoder 16 is required. This initialization is very likely to cause the R-S parity data calculated by the R-S encoder 13 prior to the trellis initialization to be erroneous. The R-S parity data must be replaced to ensure backward compatibility with legacy DTV receivers. Accordingly, the trellis encoder is connected for supplying the changed initialization byte to an encoder 17 for non-systematic (207, 187) Reed-Solomon codes, which encoder 17 re-calculates the RS parity of the affected M/H packets. The encoder 17 is connected for supplying the re-calculated R-S parity bytes to the R-S parity replacer 15, which substitutes the re-calculated R-S parity bytes for the original R-S parity bytes before they can be supplied to the modified trellis encoder 16. That is, the R-S parity replacer 15 reproduces the output of the byte interleaver 14 as the data bytes for each packet in its output signal, but reproduces the output of the non-systematic R-S encoder 17 as the R-S parity for each packet in its output signal. The R-S parity replacer 15 is connected to supply the resulting packets in its output signal to the modified trellis encoder 16 as the input signal thereto.

A synchronization multiplexer 18 is connected for receiving as the first of its two input signals the ⅔ trellis-coded data generated by the modified trellis encoder 16. The sync multiplexer 18 is connected for receiving its second input signal from a generator 19 of synchronization signals comprising the data segment sync (DSS) and the data field sync (DFS) signals. The DSS and DFS are time-division multiplexed with the ⅔ trellis-coded data per custom in the output signal from the sync multiplexer 18, which is supplied to a pilot inserter 20 as input signal thereto. The pilot inserter 20 introduces a direct component offset into the signal for the purpose of generating a pilot carrier wave during subsequent balanced modulation of a suppressed intermediate-frequency (IF) carrier wave. The output signal from the pilot inserter 20 is a modulating signal, which may be passed through a pre-equalizer filter 21 before being supplied as input signal to an 8-VSB exciter 22 to modulate the suppressed IF carrier wave. The 8-VSB exciter 22 is connected for supplying the suppressed IF carrier wave to a radio-frequency up-converter 23 to be converted upward in frequency to repose within the broadcast channel. The upconverter 23 also amplifies the power of the radio-frequency (RF) signal that it applies to the broadcast antenna 24.

Figure 10:
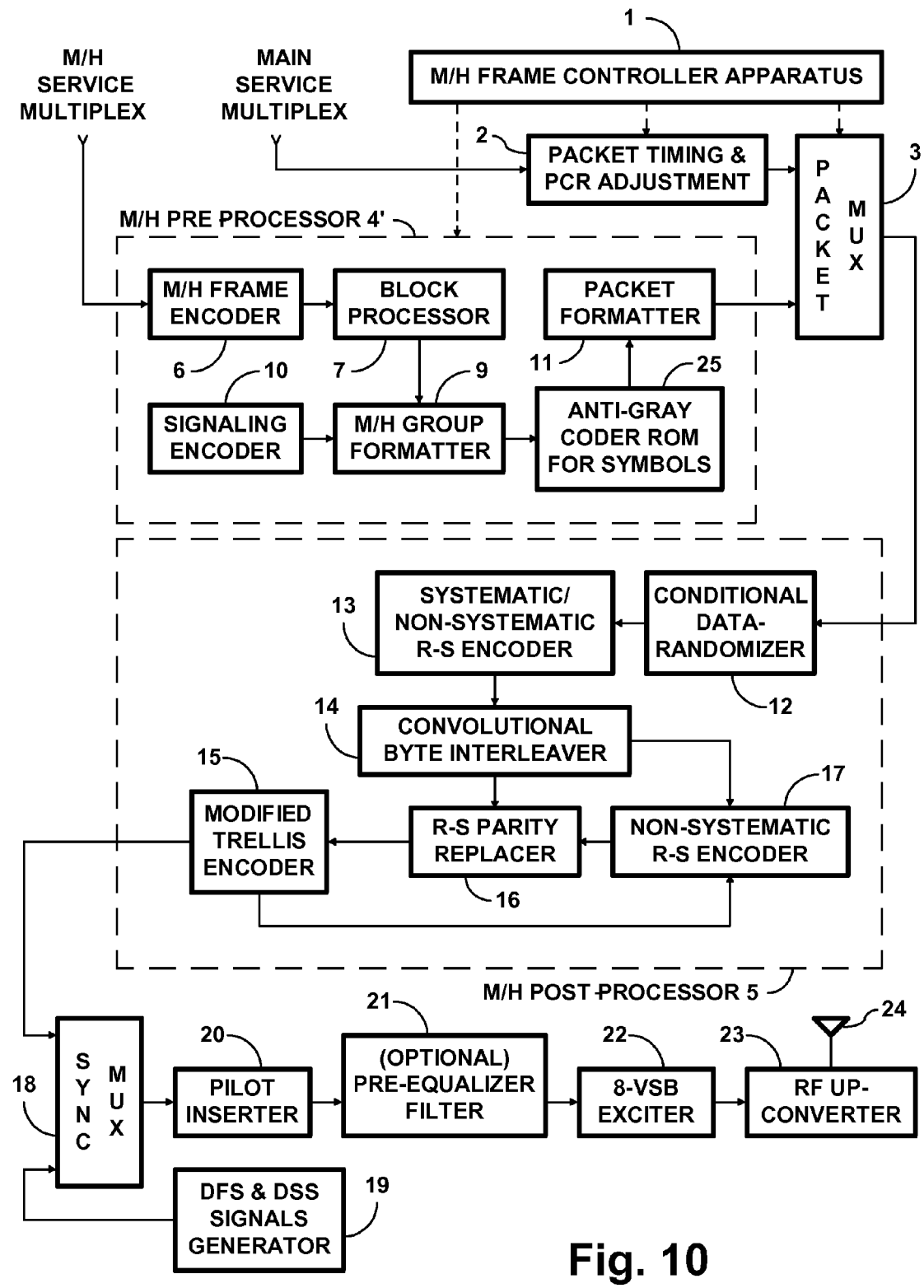
FIG. 10 is a general schematic diagram of transmitter apparatus for broadcast DTV signals using SCCC, which transmitter apparatus embodies aspects of the invention and anti-Gray codes signaling coding as well as the interleaved outer convolutional coding portion of the SCCC, according to an exemplary embodiment of the present application.

FIG. 10 shows transmitter apparatus for broadcast DTV signals using SCCC, which FIG. 10 transmitter apparatus differs from the FIG. 1 transmitter apparatus in that signaling coding is anti-Gray coded as well as the interleaved outer convolutional coding portion of the SCCC. The M/H pre-processor 4 of the FIG. 1 transmitter apparatus is replaced by an M/H pre-processor 4' in the FIG. 2 transmitter apparatus. In the M/H pre-processor 4' the interleaved outer convolutional coding from the block processor 7 is supplied directly to the group formatter 9 as input signal thereto. The connection from the block processor 7 to the group formatter 9 omits the ROM 8 used in the M/H pre-processor 4 of the FIG. 1 transmitter apparatus. In the M/H pre-processor 4' the output signal from the group formatter 9 is supplied to a read-only memory 25 as input addressing signal thereto. The ROM 25 responds to the output signal from the group formatter 9 with anti-Gray coding of consecutive, contiguous 2-bit symbols thereof. This anti-Gray coding is done in accordance with one of the different forms of symbol re-coding shown in the tables of FIGS. 2 through 9. The preferred form of symbol re-coding is that shown in FIG. 2.

Figure 11:
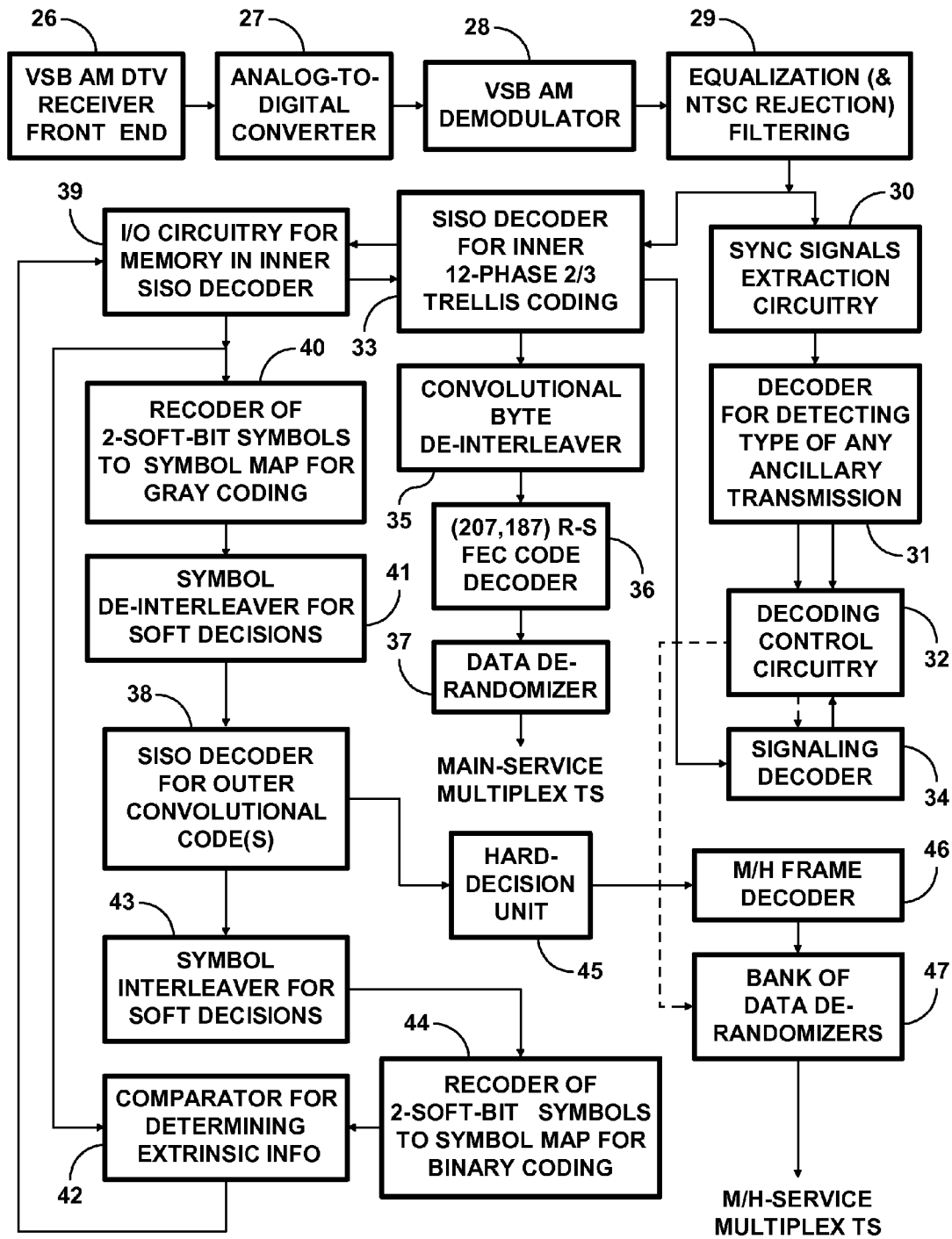
FIG. 11 is a general schematic diagram of receiver apparatus for broadcast DTV signals using SCCC in which the interleaved outer convolutional coding is anti-Gray coded, as transmitted by the FIG. 1 DTV transmitter apparatus, according to an exemplary embodiment of the present application.

FIG. 11 shows receiver apparatus for M/H signals transmitted by M/H transmitter apparatus of the sort shown in FIG. 1. The FIG. 11 receiver apparatus includes a vestigial-sideband amplitude-modulation (VSB AM) DTV receiver front-end 26 for selecting a radio-frequency DTV signal for reception, converting the selected RF DTV signal to an intermediate-frequency DTV signal, and for amplifying the IF DTV signal. An analog-to-digital converter 27 is connected for digitizing the amplified IF DTV signal supplied from the DTV receiver front-end 26. A demodulator 28 is connected for demodulating the digitized VSB AM IF DTV signal to generate a digitized baseband DTV signal, which is supplied to digital filtering 29 for equalization of channel response and for rejection of co-channel interfering NTSC signal. Sync extraction circuitry 30 is connected for receiving the digital filtering 29 response and extracting synchronization signals. Responsive to data-field-synchronization (DFS) signals, the sync extraction circuitry 30 detects the beginnings of data frames and fields. Responsive to data-segment-synchronization (DSS) signals, the sync extraction circuitry 30 detects the beginnings of data segments. The FIG. 11 DTV receiver apparatus uses the DSS and DFS signals for controlling its operations similarly to the way this is conventionally done in DTV receivers. FIG. 11 does not explicitly show the circuitry for effecting these operations.

A decoder 31 for detecting the type of any ancillary transmission responds to 8-bit sequences contained in final portions of the reserved portions of DFS signals separated by the sync extraction circuitry 30. The decoder 31 is connected for indicating the reception of M/H-service transmissions to turbo decoding control circuitry 32 that controls turbo decoding in the FIG. 11 DTV receiver apparatus. This indication from the decoder 31 conditions the turbo decoding control circuitry 32 to activate concatenated decoders 33 and 34 for extracting further information concerning the M/H-service transmission from signaling portions of the M/H-service transmission.

FIG. 11 shows the soft-input/soft-output (SISO) decoder 33 connected for receiving the digital filtering 29 response and decoding the 12-phase ⅔ trellis coding in portions of that response. In actual practice the 12-phase trellis decoder 33 shown in FIG. 11 is apt to be a plurality of component 12-phase trellis decoders, each capable of decoding the digital filtering 29 response. Such construction of the trellis decoder 33 facilitates turbo decoding of various types of SCCC being carried on independently of each other, each using separate temporary storage of data and a respective decoder for each type of outer convolutional coding. Each component decoder within the 12-phase trellis decoder 33 is a respective soft-input/soft-output (SISO) inner decoder within a turbo decoding loop.

FIG. 11 further shows the 12-phase SISO decoder 33 connected for supplying trellis-decoding results to the signaling decoder 34. In actual practice, these trellis-decoding results may be supplied by one of a plurality of component 12-phase trellis decoders in the trellis decoder 33, and the signaling decoder 34 may be connected to feed back extrinsic information to that component trellis decoder to implement turbo decoding. Each component 12-phase trellis decoder will include memory for storing the digital filtering 29 response for updating by the extrinsic information. The turbo decoding control circuitry 32 enables operation of the signaling decoder 34 during those portions of the data field that contain signaling information describing M/H-service transmission in greater detail. To keep FIG. 11 from being too cluttered to be understood readily, FIG. 11 does not explicitly show most of the connections of the turbo decoding control circuitry 32 to the elements involved in decoding the SCCC.

FIG. 11 shows the 12-phase trellis decoder 33 further connected for supplying trellis-decoding results to a byte de-interleaver 35. In actual practice, these trellis-decoding results may be supplied by one of a plurality of component 12-phase trellis decoders in the trellis decoder 33. The byte de-interleaver 35 provides byte-by-byte de-interleaving of these results to generate input signal for a Reed-Solomon decoder 36 of the de-interleaved (207, 187) R-S FEC codewords supplied from the de-interleaver 35. Preferably, but not necessarily, the de-interleaved (207, 187) R-S FEC codewords are accompanied by soft-decision information, and the R-S decoder 36 is of a sort that can use the soft-decision information to improve overall performance of the decoders 33 and 36. The R-S decoder 36 is connected for supplying packets of randomized hard-decision data to a data de-randomizer 37, which exclusive-ORs the bits of the randomized hard-decision data with appropriate portions of the PRBS prescribed in A/53, Annex D, §4.2.2 to generate a first transport stream. This first transport stream is constituted in part of MPEG-2-compatible packets of de-randomized principal data. Insofar as the R-S decoder 36 is capable, it corrects the hard-decision 187-byte randomized data packets that it supplies to the data de-randomizer 37. The output signal from the data de-randomizer 37 reproduces the main-service multiplex transport stream. Receivers intended for just the reception of M/H-service data will omit the byte de-interleaver 35, the R-S decoder 36 and the data de-randomizer 37.

FIG. 11 shows the 12-phase trellis decoder 33 further connected as a soft-input, soft-output (SISO) inner decoder in a turbo decoding loop that also includes a soft-input, soft-output (SISO) outer decoder 38. In actual practice, another of a plurality of component 12-phase trellis decoders in the decoder 33 is connected to function as the SISO inner decoder in this turbo decoding loop. Then, the outer SISO decoder 38 is connected to feed back extrinsic information to that component trellis decoder to implement turbo decoding. The turbo decoding procedures often involve iterations of both decoding of the inner convolutional code of the SCCC by the SISO trellis decoder 33 and decoding of the outer convolutional code of the SCCC by the outer SISO decoder 38. The component 12-phase trellis decoder will include memory for storing the digital filtering 29 response for updating by the extrinsic information. The decoding operations of the decoders 33 and 38 are staggered in time. The decoders 33 and 38 may be of types that use the soft-output Viterbi algorithm (SOVA) for evaluating code trellises, but preferably, but not necessarily, are of types that use the logarithmic maximum a posteriori algorithm (log-MAP) for such evaluations. In any case, both of the decoders 33 and 38 comprise memory for temporary storage of the soft-decisions that they respectively generate.

Input/output circuitry 39 is used for accessing selected portions of the memory in the trellis decoder 33 for temporary storage of soft-decisions related to the inner convolutional coding and to the symbol-interleaved outer convolutional coding of the SCCC. This input/output circuitry 39 includes a memory address generator, the operation of which is controlled by the turbo code decoding control circuitry 32. Responsive to control by the turbo code decoding control circuitry 32, the input/output circuitry 39 reads soft-decisions related to the reproduced anti-Gray-coded interleaved outer convolutional coding of the SCCC to the cascade connection of a symbol re-coder 40 and a symbol de-interleaver 41. The input/output circuitry 39 also reads those soft-decisions another, later time to a comparator unit 42 as one of its input signals. The cascade connection of the symbol re-coder 40 and the symbol de-interleaver 41 is collectively referred to as a "symbol processor" in the claims appended to this specification.

In accordance with an aspect of the invention, the symbol re-coder 40 is connected for re-coding the soft decisions related to the reproduced symbol-interleaved and anti-Gray-coded outer convolutional coding of the SCCC such that they appear to have originated from the use of a symbol map for Gray-coded modulation rather than from a symbol map for binary-coded modulation. Presuming the soft decisions consist of two soft bits, each soft bit expressed in logarithmic likelihood ratio (LLR) or similar format, this re-coding procedure may be loosely referred to as a Gray coding procedure on the soft bits. The symbol de-interleaver 41 is complementary to a symbol interleaver in the block processor 7 of the FIG. 1 or FIG. 10 transmitter apparatus, which symbol interleaver performs interleaving 2-bit symbol by 2-bit symbol. The symbol de-interleaver 41 is connected for de-interleaving the symbol-interleaved outer convolutional coding of the SCCC 2-soft-bit symbol by 2-soft-bit symbol and supplying the resulting de-interleaved outer convolutional coding to the outer SISO decoder 38 as "soft" input signal thereto. The symbol de-interleaver 41 can be constructed in a usual way using random-access memory (RAM) written with write addressing different from its read addressing when subsequently read. However, the proximity of the symbol de-interleaver 41 to the decoder 33 in the FIG. 11 receiver apparatus allows the symbol de-interleaving to be provided by appropriate read addressing of memory already included within the decoder 33. The outer SISO decoder 38 is connected for supplying soft decisions concerning its decoding results to a symbol interleaver 43 that interleaves the soft decisions to generate input signal for a symbol re-coder 44. The pattern of 2-soft-bit symbol by 2-soft-bit symbol interleaving by the symbol interleaver 43 corresponds to the 2-bit symbol by 2-bit symbol interleaving by the symbol interleaver in the block processor 7 of the FIG. 1 or FIG. 10 transmitter apparatus. The symbol interleaver 43 can be constructed in a usual way using RAM written with write addressing different from its read addressing when subsequently read. However, the proximity of the symbol interleaver 43 to the decoder 38 in the FIG. 11 receiver apparatus allows the symbol de-interleaving to be provided by appropriate read addressing of memory already included within the decoder 38.

The symbol re-coder 44 responds to input signal from the interleaver 43 to supply soft decisions that are re-coded to the anti-Gray coding regime associated with the use of a symbol map for binary-coded modulation rather than a symbol map for Gray-coded modulation. The comparator unit 42 for determining extrinsic information feedback is connected for receiving the interleaved soft decisions in the anti-Gray coding regime that the inner SISO decoder 33 and the symbol re-coder 44 respectively supply as their output signals. The comparator unit 42 contains memory for temporarily storing the soft decisions supplied from the SISO coder 33 until soft decisions are subsequently supplied from the SISO decoder 38 via the interleaver 43 and the re-coder 44 for anti-Gray coding "soft" symbols. The comparator unit 42 then compares the two sets of "soft" symbols for determining "soft" symbols of extrinsic information. This extrinsic information is coded in accordance with the anti-Gray coding regime associated with the use of a symbol map for binary-coded modulation rather than a symbol map for Gray-coded modulation. So, this extrinsic information is appropriate for closing the turbo decoding loop by being fed back via the I/O circuitry 39 to memory within the SISO decoder 33 for updating stored soft input data. The stored soft input data as so updated will be used by the inner SISO decoder 33 in any iteration of its decoding procedure. Two-soft-bit symbols of this extrinsic information is also used to modify the soft decisions that the I/O circuitry 39 supplies to the symbol processor comprising the cascade connection of the symbol re-coder 40 and the symbol de-interleaver 41.

FIG. 11 shows the SISO decoder 38 connected for supplying its soft decisions to hard-decision circuitry 45, which generates hard decisions responsive to the soft decisions supplied thereto. The hard-decision circuitry 45 is connected to supply the resulting hard decisions as to the randomized data to an M/H frame decoder 46 as input signal thereto. The M/H Frame decoder 46 includes decoders for RS Frames, which FIG. 11 does not explicitly show. Hard decisions related to each RS Frame are collected into bytes that are written into rows of byte storage locations in a respective byte-organized framestore memory. Each row of bytes written into the framestore memory includes a checksum for cyclic-redundancy-check (CRC) coding, and each column of those bytes is a transversal Reed-Solomon codeword that is decoded using a byte-error-correcting algorithm that employs the CRC coding as an error-locating code. The M/H Frame decoder 46 is connected for supplying its output signal to a bank 47 of data de-randomizers as their input signals, each decoder for an RS Frame having a respective data de-randomizer. The turbo decoding control circuitry 32 is connected for supplying a control signal that selects the response of one of the bank 47 of data de-randomizers that is suitable for reproducing the M/H-service multiplex transport stream.

Figure 12:
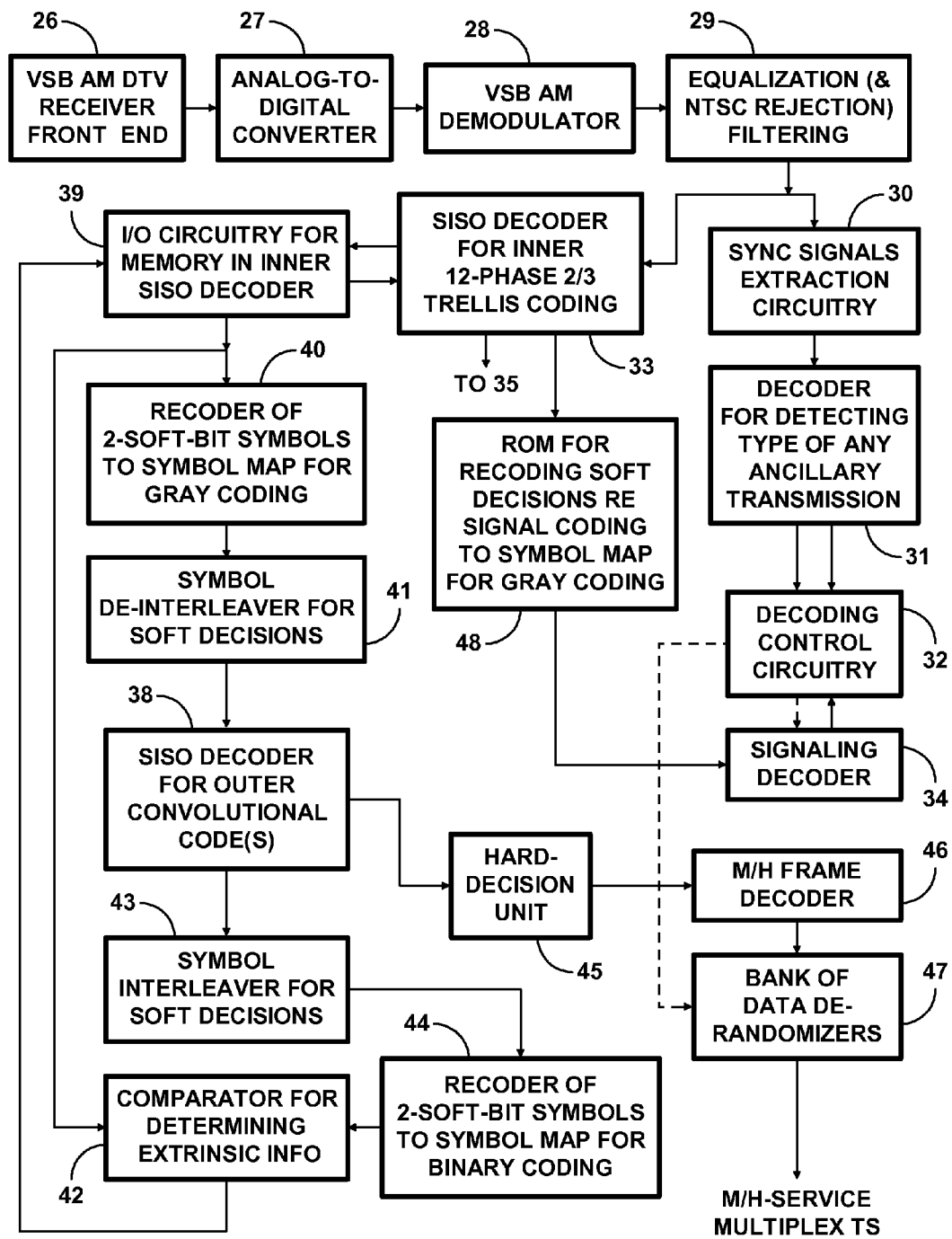
FIG. 12 is a general schematic diagram of receiver apparatus for broadcast DTV signals using SCCC in which the interleaved outer convolutional coding is anti-Gray coded, as transmitted by the FIG. 10 DTV transmitter apparatus, according to an exemplary embodiment of the present application.

FIG. 12 shows receiver apparatus for M/H signals transmitted by M/H transmitter apparatus of the sort shown in FIG. 10. The principal difference from the FIG. 1 receiver apparatus is that the signaling decoder 34 is not connected to receive its input signal directly from the decoder 33 for 12-phase trellis codes. Instead, the signaling decoder 34 is connected to receive its input signal read from a symbol re-coder 48 addressed by output signal from the SISO decoder 33. The symbol re-coder 48 is similar to the symbol re-coder 40 and, like symbol re-coder 40, Gray codes the soft decisions related to the reproduced anti-Gray-coded (interleaved) outer convolutional coding of the SCCC.

Figure 13:
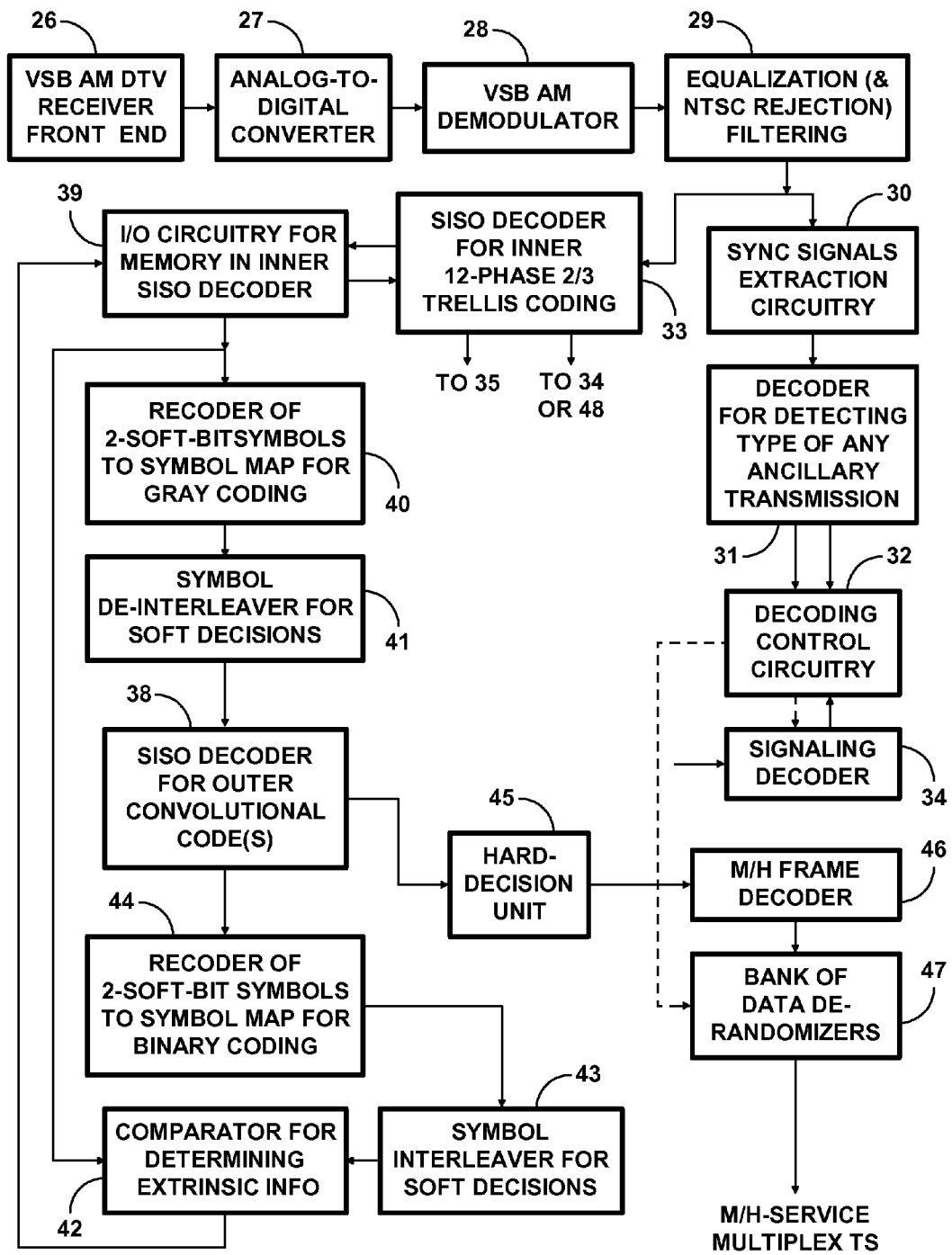
FIGS. 13, 14, 15 and 16 are schematic diagrams showing various modifications that can be made either to the FIG. 11 DTV receiver apparatus or to the FIG. 12 DTV receiver apparatus, which modifications concern the way in which extrinsic information is derived for feeding back to the trellis code decoder, according to exemplary embodiments of the present application.

FIG. 13 shows a modification that can be made to the receiver apparatuses of FIGS. 11 and 12. FIG. 13 shows the positions of the symbol interleaver 43 and the symbol re-coder 44 in their cascade connection having been interchanged, such that the symbol re-coder 44 precedes the interleaver 43 within the symbol processor linking the I/O circuitry 39 to the outer SISO decoder 38.

Figure 14:
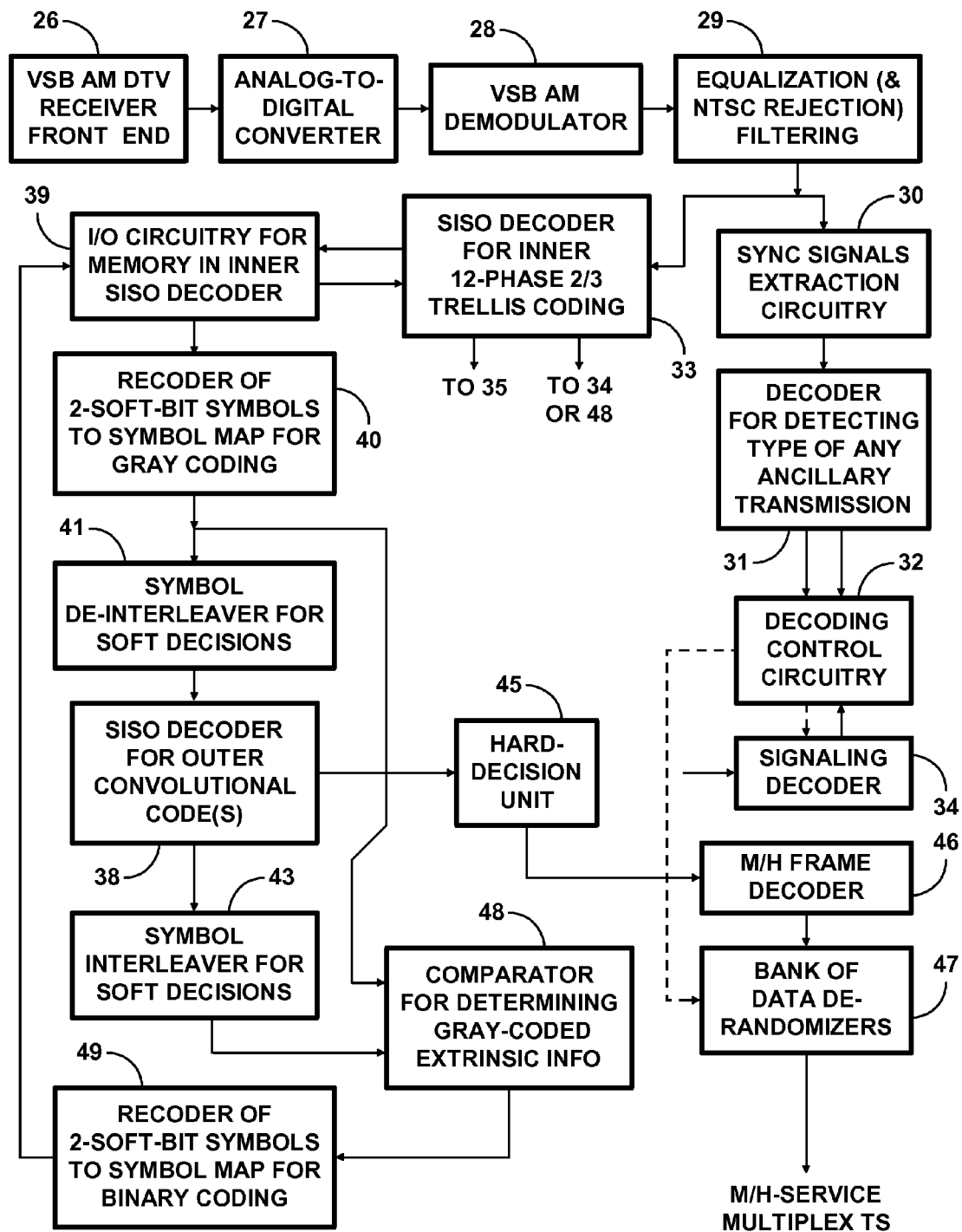

FIG. 14 shows a different modification of the FIG. 11 and FIG. 12 receiver apparatuses that provides further receiver apparatuses embodying the invention. The comparator unit 42 for determining de-interleaved extrinsic information and the symbol re-coder 44 for re-coding interleaved soft decisions to the anti-Gray coding regime are replaced. FIG. 14 shows a comparator unit 48 for determining Gray-coded extrinsic information, which comparator unit 48 is connected for comparing the response from the symbol re-coder 40 with the response from the symbol interleaver 43 for soft decisions from the SISO decoder 38. A symbol re-coder 49 is connected to receive the Gray-coded extrinsic information as its input signal. The symbol re-coder 49 responds to supply extrinsic information that is re-coded to the anti-Gray coding regime. Symbol re-coder 49 is connected for supplying two-soft-bit symbols of that extrinsic information to the I/O circuitry 39 used for accessing selected portions of the memory in the inner SISO decoder 33, which connection closes the turbo decoding loop for the FIG. 14 DTV receiver. This extrinsic information will be used by the inner SISO decoder 33 in any iterative turbo decoding procedure that it performs.

Figure 15:
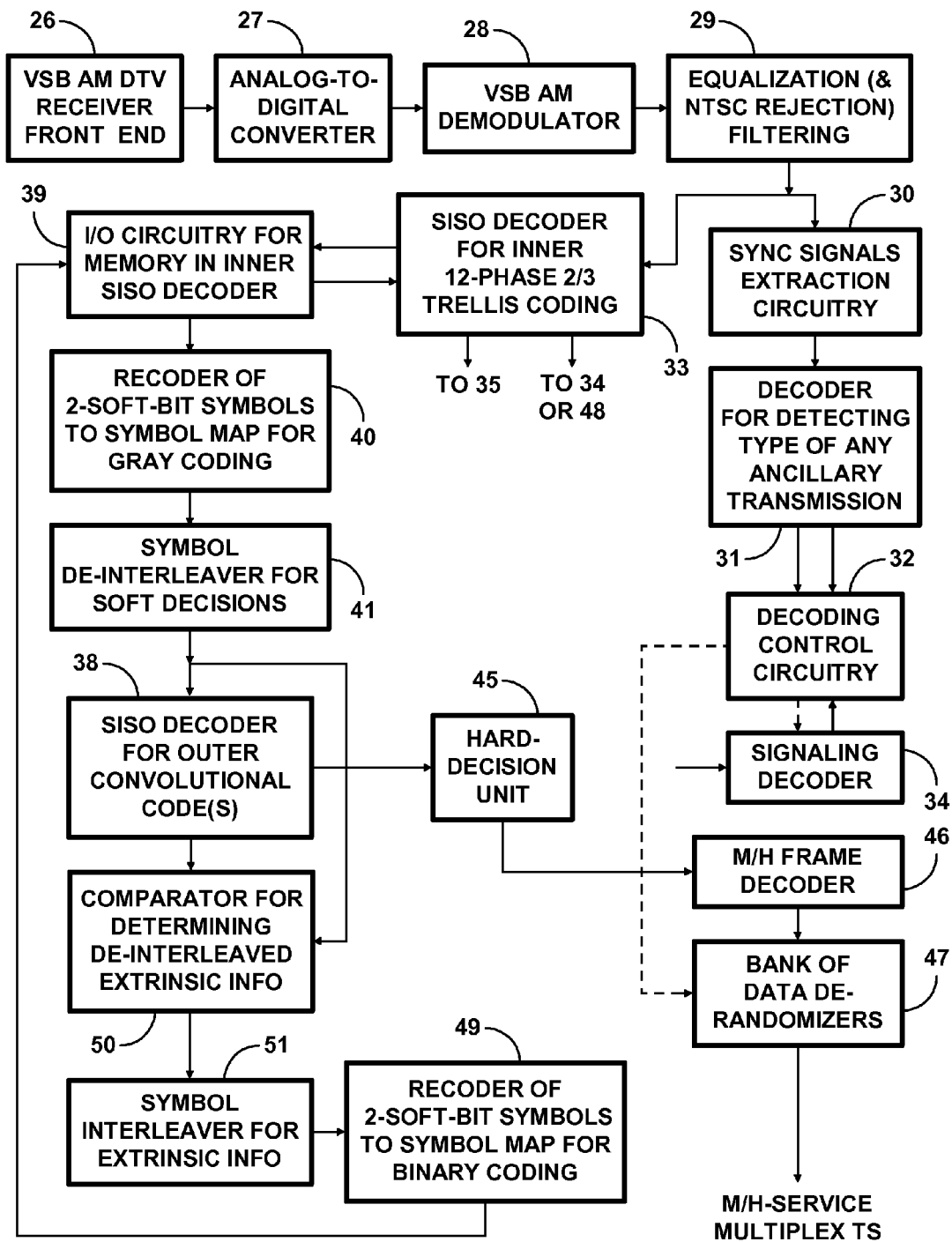
Figure 16:
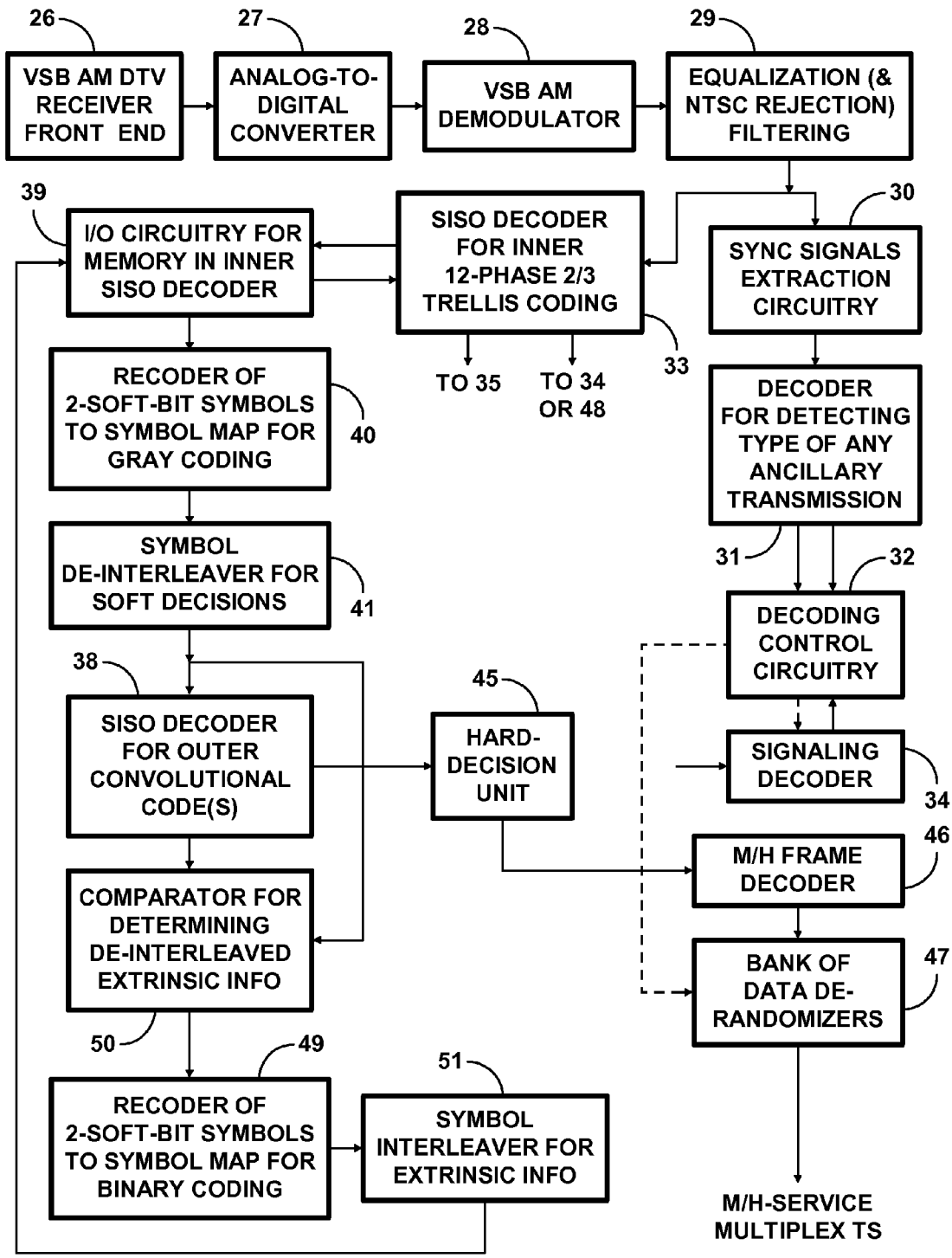

FIGS. 15 and 16 show still other possible modifications of the FIG. 11 and FIG. 12 receiver apparatuses. The comparator unit 42 for determining de-interleaved extrinsic information, the symbol interleaver 43 for interleaving soft decisions, and the symbol re-coder 44 for re-coding interleaved soft decisions to the anti-Gray coding regime are replaced in both FIGS. 15 and 16. In both FIGS. 15 and 16 a comparator unit 50 for determining de-interleaved Gray-coded extrinsic information is connected for comparing the soft-decision output signal from the outer SISO decoder 38 with the "soft" input signal to the SISO decoder 38.

In FIG. 15 a symbol interleaver 51 is connected for receiving two-soft-bit symbols of de-interleaved Gray-coded extrinsic information from the comparator unit 50 and re-interleaving them to supply input signal to the symbol re-coder 49. The symbol re-coder 49 responds to supply extrinsic information that is re-coded to the anti-Gray coding regime associated with the use of a symbol map for binary-coded modulation rather than from a symbol map for Gray-coded modulation. Symbol re-coder 49 is connected for supplying two-soft-bit symbols of that extrinsic information to the input/output circuitry 39 used for accessing selected portions of the memory in the inner SISO decoder 33, which connection closes the turbo decoding loop for the FIG. 15 DTV receiver. This extrinsic information will be used by the inner SISO decoder 33 in any iterative turbo decoding procedure that it performs.

In FIG. 16 the symbol re-coder 49 is connected for receiving two-bit symbols of de-interleaved Gray-coded extrinsic information from the comparator unit 50 as input signal. The symbol re-coder 49 responds to supply de-interleaved extrinsic information that is re-coded to the anti-Gray coding regime associated with the use of a symbol map for binary-coded modulation rather than from a symbol map for Gray-coded modulation. The symbol interleaver 51 is connected for receiving two-soft-bit symbols of the de-interleaved extrinsic information that has been re-coded to the anti-Gray coding regime. The symbol interleaver 51 is further connected for supplying two-soft-bit symbols of this re-interleaved extrinsic information to the input/output circuitry 39 used for accessing selected portions of the memory in the inner SISO decoder 33, which connection closes the turbo decoding loop for the FIG. 16 DTV receiver. This extrinsic information will be used by the inner SISO decoder 33 in any iterative turbo decoding procedure that it performs.

Figure 17:
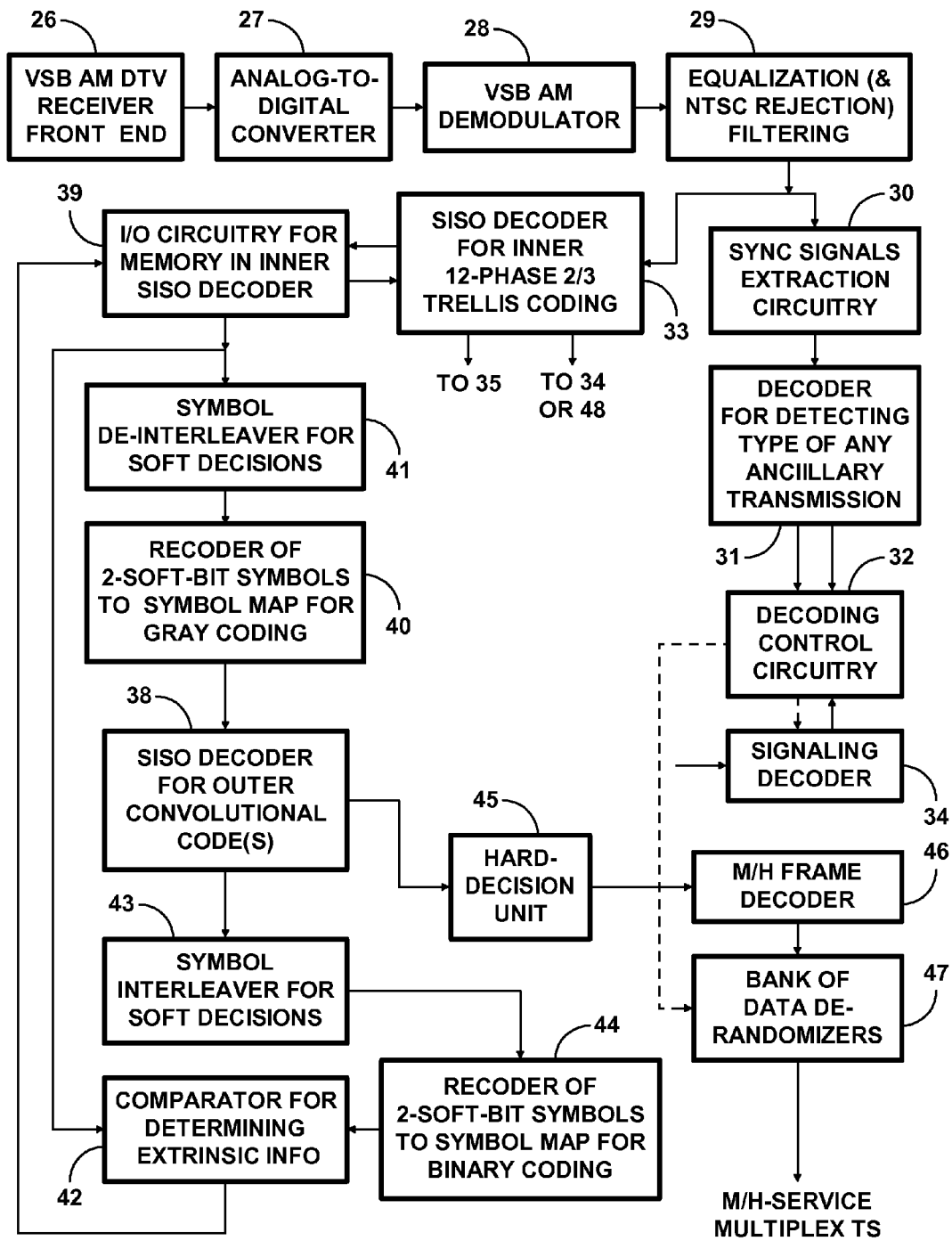
FIG. 17 is a schematic diagrams showing a modification that can be made either to the FIG. 11 DTV receiver apparatus or to the FIG. 12 DTV receiver apparatus, which modification concerns the order in which de-interleaving and Gray coding are done following the trellis code decoder, according to an exemplary embodiment of the present application.

FIG. 17 shows another modification that can be made to the receiver apparatuses of FIGS. 11 and 12, which modification affects the symbol processor comprising the symbol de-interleaver 41 and the symbol re-coder 40 in cascade connection. FIG. 17 shows the positions of the symbol de-interleaver 41 and the symbol re-coder 40 in their cascade connection having been interchanged, such that the de-interleaver 41 precedes the symbol re-coder 40.

Figure 18:
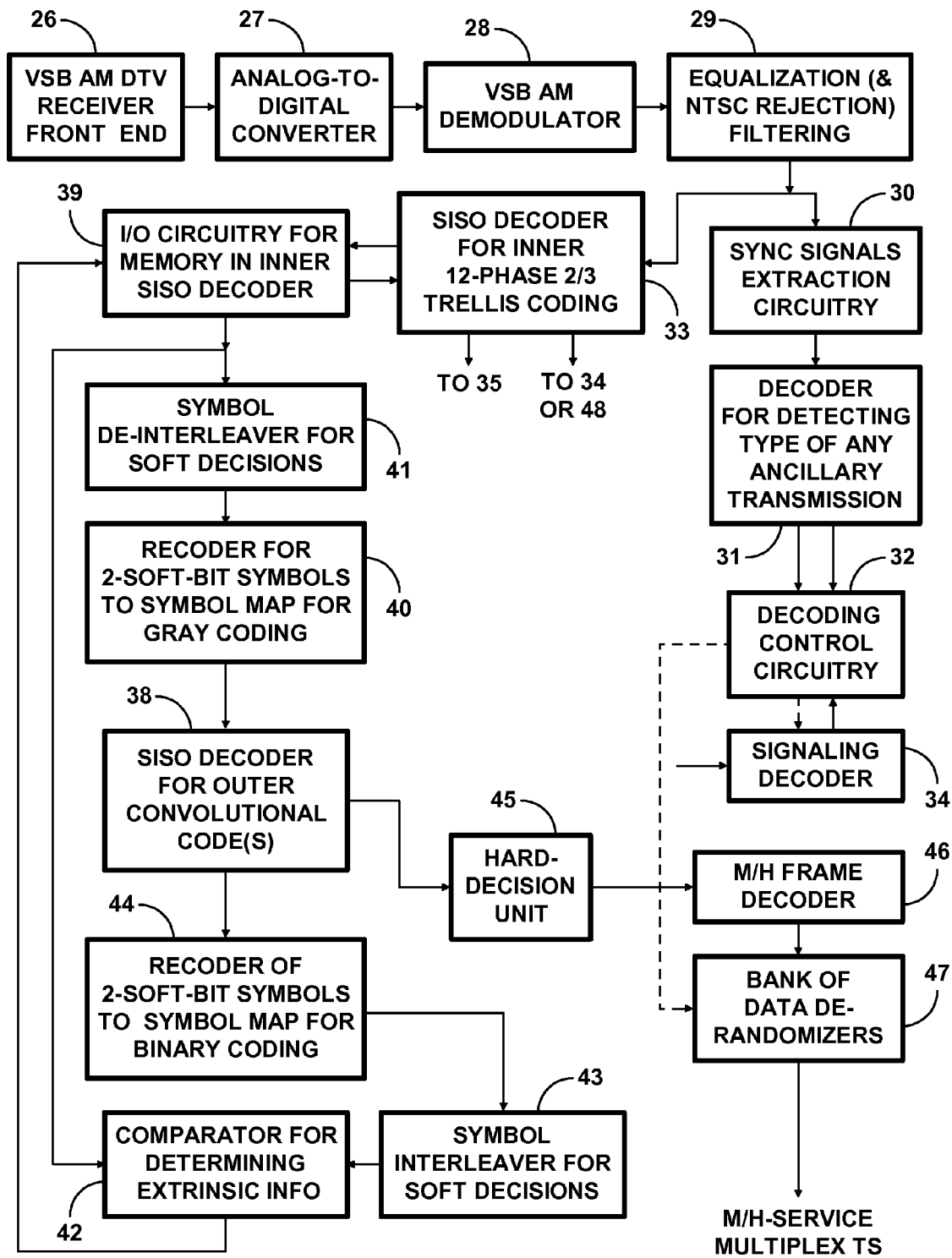
FIGS. 18, 19, 20 and 21 are schematic diagrams showing various modifications that can be made either to the FIG. 17 DTV receiver apparatus, which modifications concern the way in which extrinsic information is derived for feeding back to the trellis code decoder, according to exemplary embodiments of the present application.

FIG. 18 shows a modification that can be made to the FIG. 13 receiver apparatus, which modification affects the symbol processor comprising the symbol de-interleaver 41 and the symbol re-coder 40 in cascade connection. FIG. 18 shows the positions of the symbol de-interleaver 41 and the symbol re-coder 40 in their cascade connection having been interchanged, such that the de-interleaver 41 precedes the symbol re-coder 40.

Figure 19:
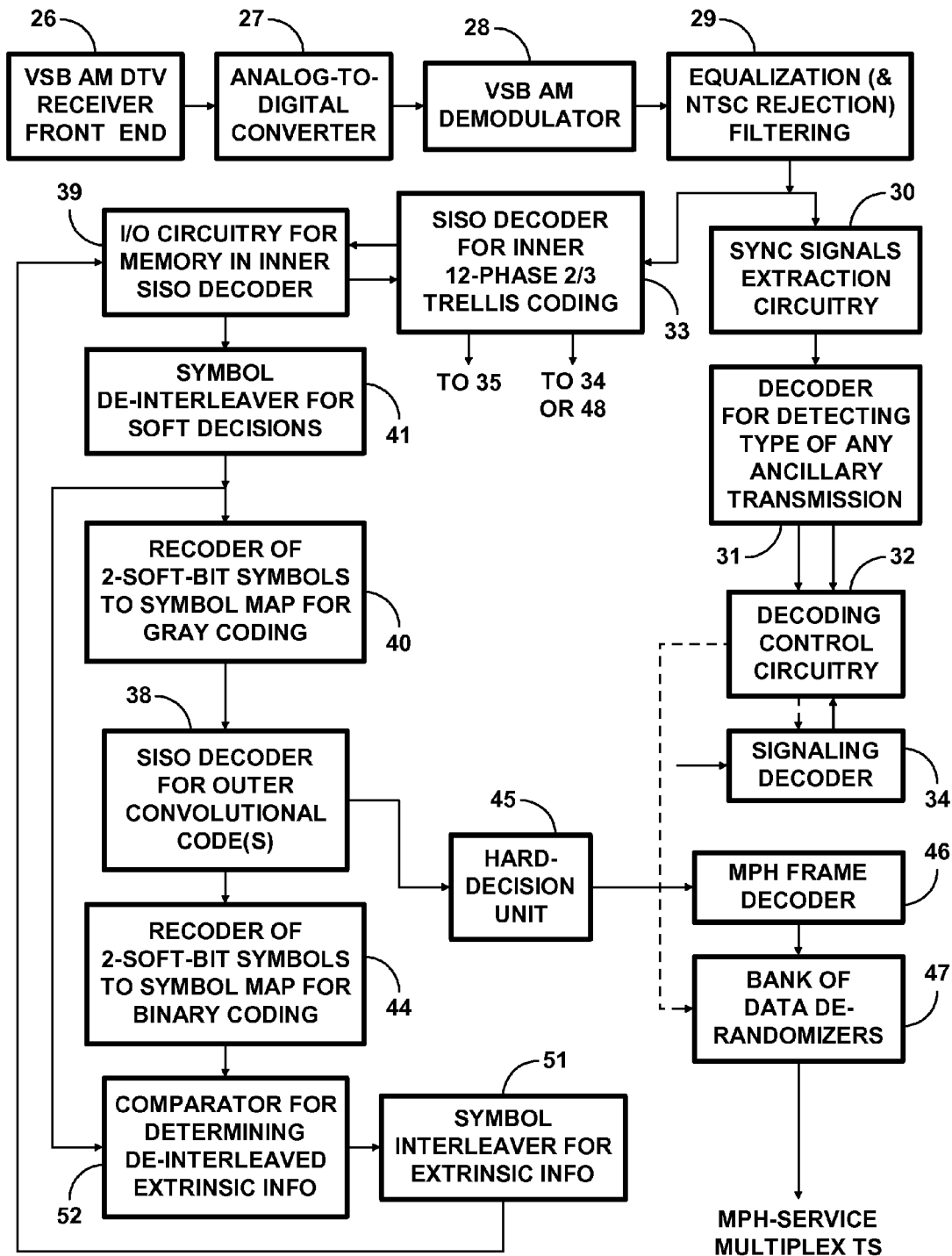

FIG. 19 shows a different modification of the FIG. 17 receiver apparatus that provides further receiver apparatuses that embody the invention. FIG. 19 shows the symbol re-coder 44 being connected for receiving its input signal directly from the SISO decoder 38 as in FIGS. 17 and 18. The response from the symbol re-coder 44 re-codes the de-interleaved soft decisions to the anti-Gray coding regime associated with the use of a symbol map for binary-coded modulation rather than from a symbol map for Gray-coded modulation. The comparator unit 42 for determining de-interleaved extrinsic information and the interleaver 43 for soft decisions of FIGS. 17 and 18 are replaced in FIG. 19 by a comparator unit 52 for determining de-interleaved extrinsic information and the symbol interleaver 51 for re-interleaving two-soft-bit symbols of the de-interleaved extrinsic information. The symbol re-coder 44 is further connected for supplying the re-coded de-interleaved soft decisions to the comparator unit 52 for determining de-interleaved extrinsic information, as one of two input signals thereto. The response of the symbol de-interleaver 41 for soft decisions from the I/O circuitry 39 is applied to the comparator unit 52 as the other input signal thereto. The comparator unit 52 is connected for supplying two-soft-bit symbols of de-interleaved extrinsic information to the symbol interleaver 51. The symbol interleaver 51 interleaves the successive 2-soft-bit symbols of extrinsic information for application to the input/output circuitry 39 used for accessing selected portions of the memory in the inner SISO decoder 33, which connection closes the turbo decoding loop for the FIG. 19 DTV receiver. This extrinsic information will be used by the inner SISO decoder 33 in any iterative turbo decoding procedure that it performs.

Figure 20:
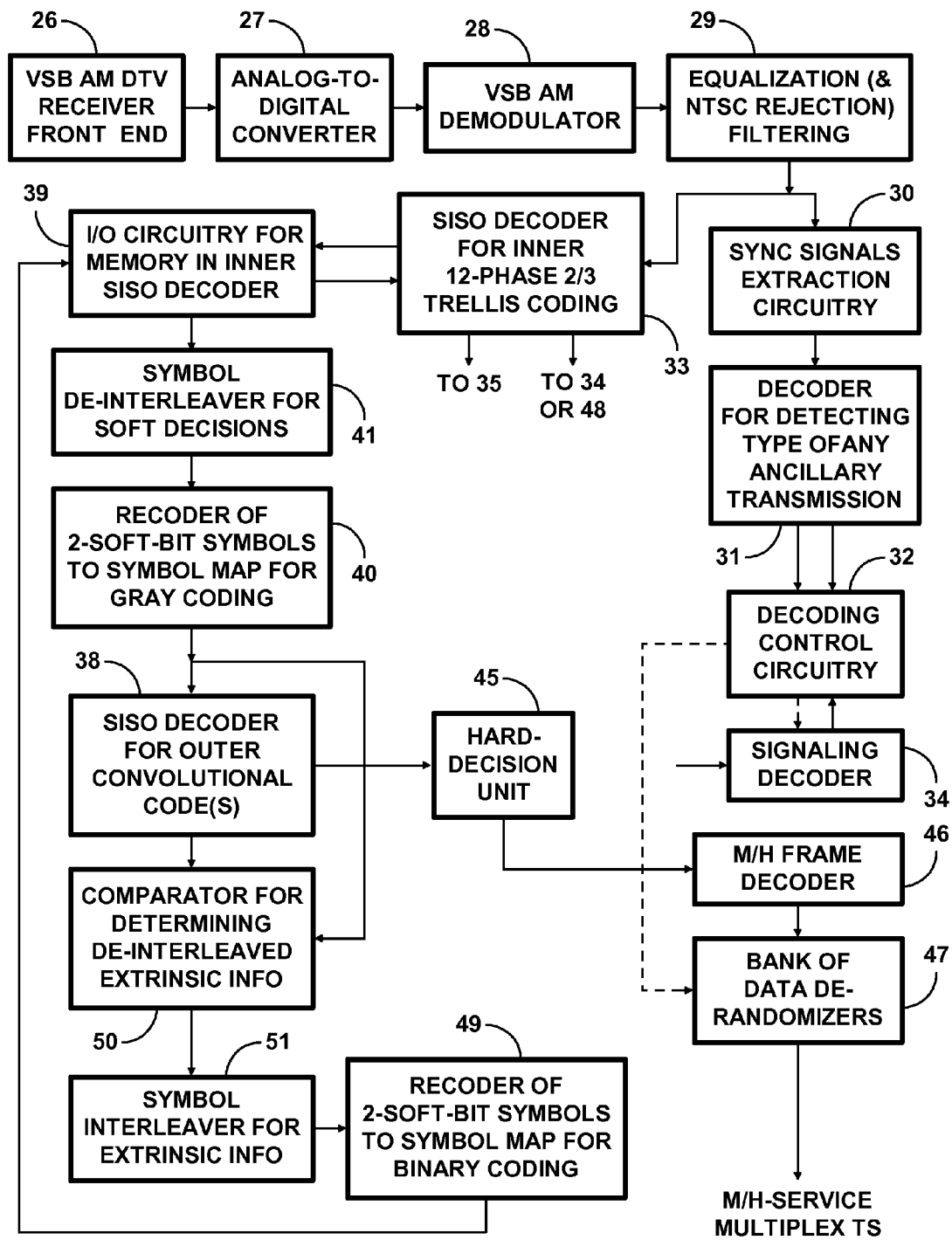

FIG. 20 shows a modification that can be made to the FIG. 15 receiver apparatus, which modification affects the symbol processor comprising the symbol de-interleaver 41 and the symbol re-coder 40 in cascade connection. FIG. 20 shows the positions of the symbol de-interleaver 41 and the symbol re-coder 40 in their cascade connection having been interchanged, such that the de-interleaver 41 precedes the symbol re-coder 40.

Figure 21:
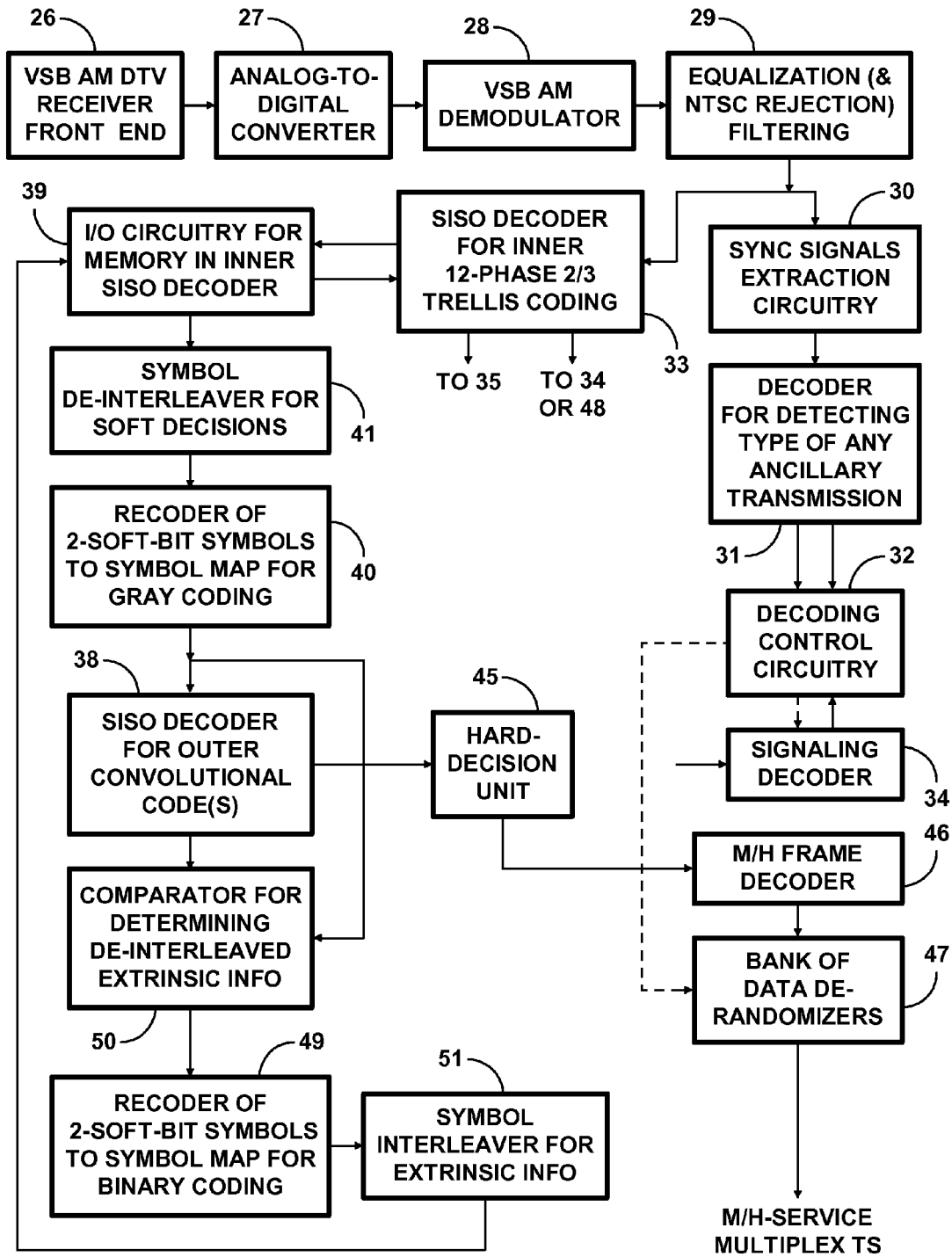

FIG. 21 shows a modification that can be made to the FIG. 16 receiver apparatus which modification affects the symbol processor comprising the symbol de-interleaver 41 and the symbol re-coder 40 in cascade connection. FIG. 21 shows the positions of the symbol de-interleaver 41 and the symbol re-coder 40 in their cascade connection having been interchanged, such that the de-interleaver 41 precedes the symbol re-coder 40.

Figure 22:
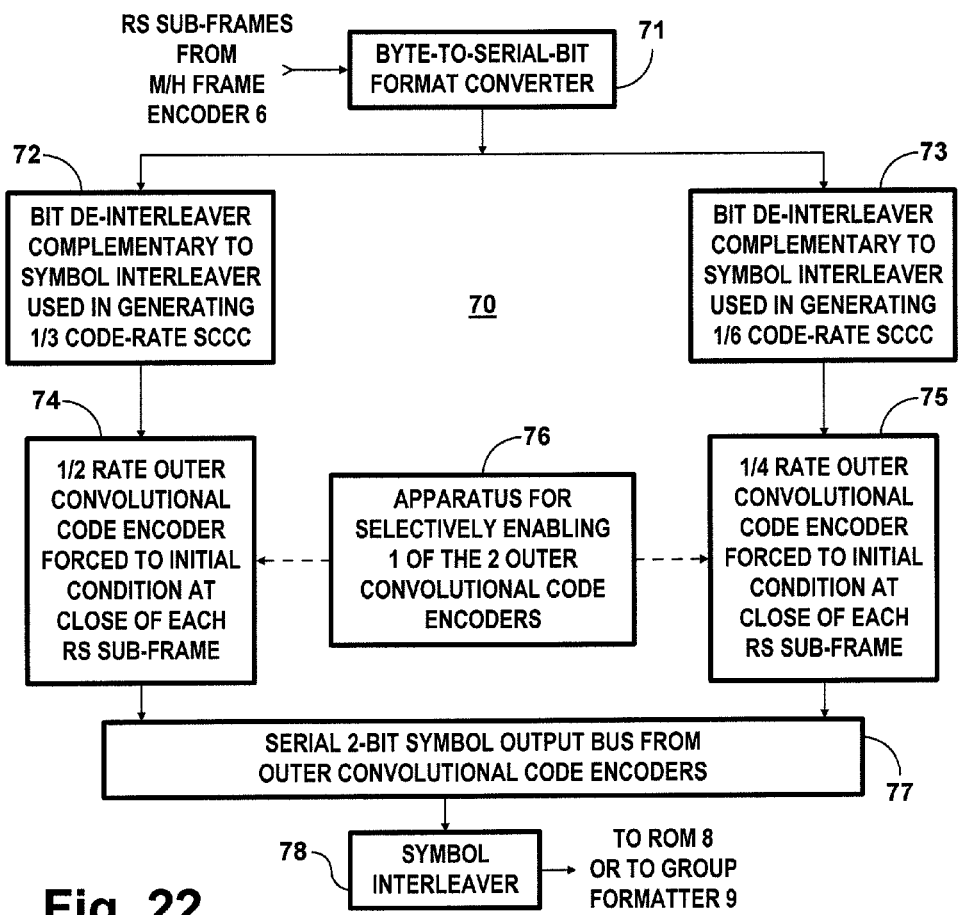
FIG. 22 is a schematic diagram of a modified block processor that replaces the block processor in modified FIG. 1 transmitter apparatus and in modified FIG. 10 transmitter apparatus, according to an exemplary embodiment of the present application.

FIG. 22 shows a block processor 70 comprising elements 71-79 that may be used as the block processor 7 in the FIG. 1 DTV transmitter apparatus or in the FIG. 10 DTV transmitter apparatus. The M/H frame encoder 6 is connected for supplying sub-frames of RS Frames in 8-bit byte format as input signal to a byte-to-serial-bit format converter 71. The format converter 71 is connected for supplying the M/H frame encoder 6 response as converted to serial-bit format as input signals to a bit de-interleaver 72 and to a bit de-interleaver 73, both within the block processor 70. The bit de-interleaver 72 is a block de-interleaver that de-interleaves the bits of each successive block so as to complement the symbol interleaving that will follow one-half-rate outer convolutional coding. The bit de-interleaver 72 is connected to supply the M/H frame encoder 6 response after bit-by-bit de-interleaving to an encoder 74 for one-half-rate outer convolutional coding. The bit de-interleaver 73 is a block de-interleaver that de-interleaves the bits of each successive block so as to complement the symbol interleaving that will follow one-quarter-rate outer convolutional coding. The bit de-interleaver 73 is connected to supply the M/H frame encoder 6 response after bit-by-bit de-interleaving to encoders 75 and 76 for one-quarter-rate outer convolutional coding. The encoders 75 and 76 provide respective ones of the two types of one-quarter-rate outer convolutional coding specified in A/153.

FIG. 22 shows apparatus 77 for selectively enabling operation of the encoders 74, 75 and 76 one at a time. If the encoders 74, 75 and 76 have separate physical structures, the apparatus 77 for selectively enabling operation can by way of example be such as to supply operating power just to a selected one of the encoders 74, 75 and 76. In actual practice the encoders 74, 75 and 76 are apt to use elements in common.

In such case the apparatus 77 will comprise selective connection circuitry for selecting the desired outer convolutional coding. FIG. 22 shows the encoders connected for supplying their respective responses to an output bus 78. The one of the encoders 74, 75 and 76 selected for current operation supplies two-bit symbols serially to the output bus 78 for subsequent application to a symbol interleaver 79. The symbol interleaver 79 is connected for supplying the interleaved two-bit symbols to the anti-Gray-coding ROM 8 in the FIG. 1 transmitter apparatus or to the M/H Group formatter 9 in the FIG. 10 DTV transmitter apparatus.

Figure 23:
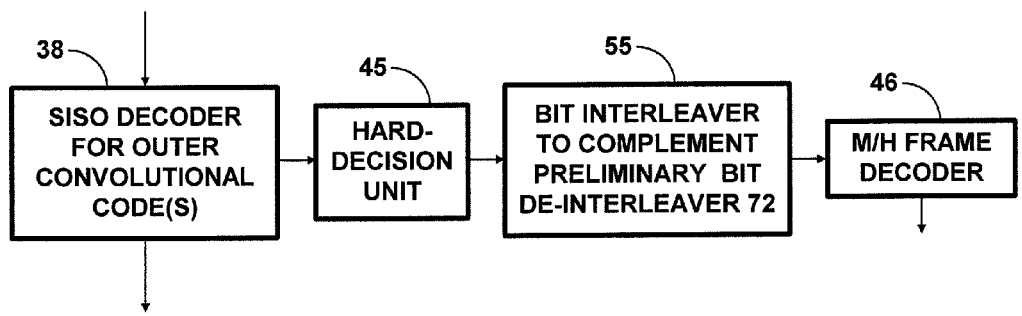
FIG. 23 is a schematic diagram of a modification that can be made to any of the receiver apparatuses of FIGS. 11 through 21 fitting it to receive M/H-service signals transmitted by the FIG. 1 or FIG. 10 transmitter apparatus as modified to use the FIG. 22 block processor, according to an exemplary embodiment of the present application.

FIG. 23 is a schematic diagram of a modification that can be made to any of the receiver apparatuses of FIGS. 11 through 21 fitting it to receive M/H-service signals transmitted by the modified FIG. 1 transmitter apparatus or by the modified FIG. 10 transmitter apparatus. In the FIG. 23 modification the M/H Frame decoder 46 is not supplied the response of the hard-decision unit 45 directly. Instead, the response of the hard-decision unit 45 is applied as input signal to a bit interleaver 55. The bit interleaver 55 is connected to supply its response as input signal to the M/H Frame decoder 46. In the bit interleaver 55 response the order of bits from the hard-decision unit 45 response are shuffled to compensate for the preliminary de-interleaving of bits by the bit de-interleaver 72 in the block processor 70 of modified FIG. 1 or FIG. 10 transmitter apparatus. The need for the bit de-interleaver 55 following the hard-decision unit 45 can be avoided in modifications of certain of the receiver apparatuses thusfar described. Changing the point in the turbo-decoding loop from which input signal for the hard-decision unit 45 is taken accomplishes this.

Figure 24:
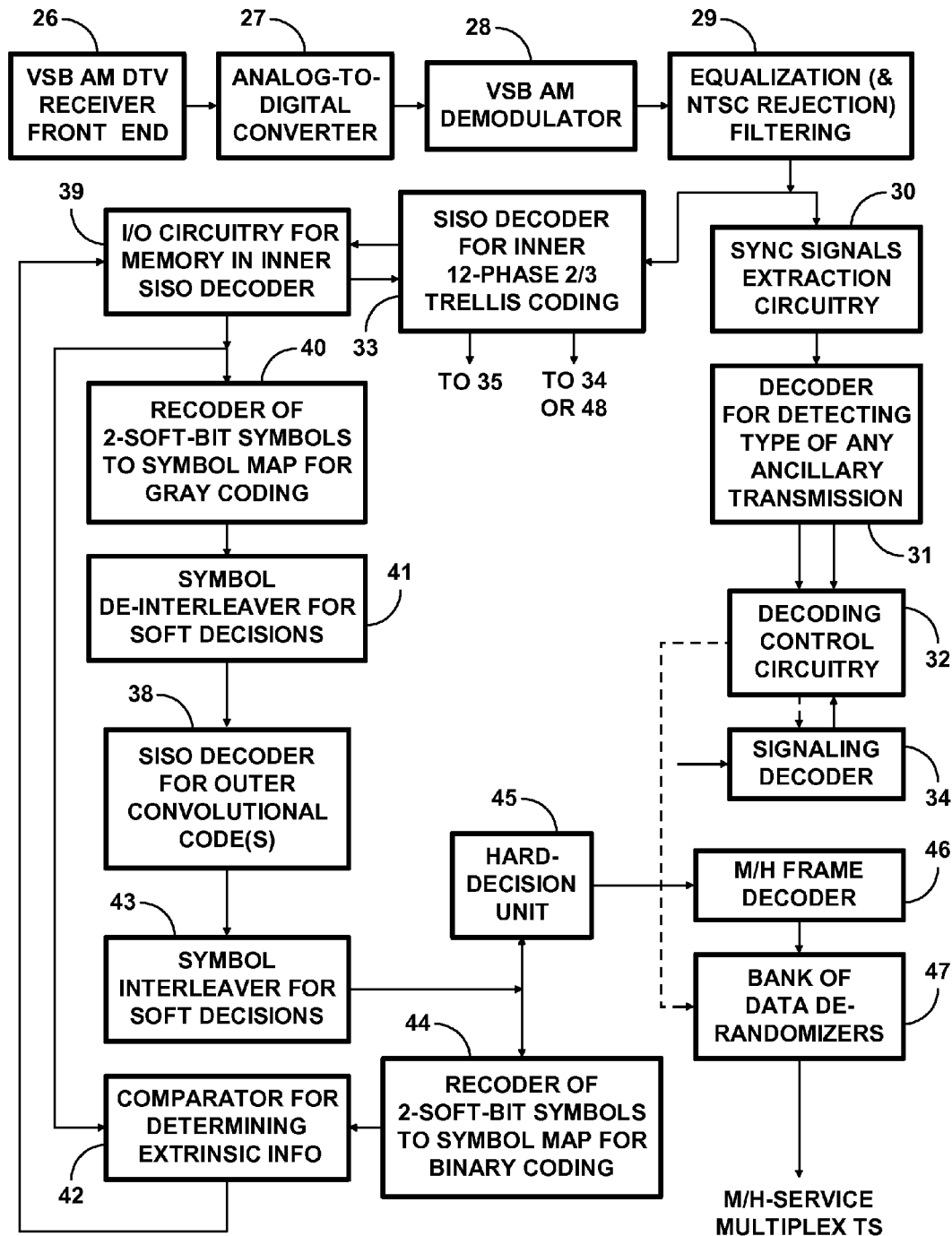
FIG. 24 is a schematic diagram of receiver apparatus modified from those shown in FIGS. 11 and 12, which FIG. 24 receiver apparatus is suited for receiving M/H-service signals transmitted by the FIG. 1 or FIG. 10 transmitter apparatus as modified to use the FIG. 22 block processor, according to an exemplary embodiment of the present application.

FIG. 24 is a schematic diagram of receiver apparatus modified from those shown in FIGS. 11 and 12, which FIG. 24 receiver apparatus is suited for receiving M/H-service signals from the transmitter apparatus of FIG. 1 or FIG. 10 as modified to use the FIG. 22 block processor. The hard-decision unit 45 is connected for receiving input signal supplied as response from the symbol interleaver 43 for soft decisions from the SISO decoder 38. This avoids the need for the bit de-interleaver 55 following the hard-decision unit 45 in order to compensate for the preliminary de-interleaving of bits by the bit de-interleaver 72 in the block processor 70 of modified FIG. 1 or FIG. 10 transmitter apparatus.

Figure 25:
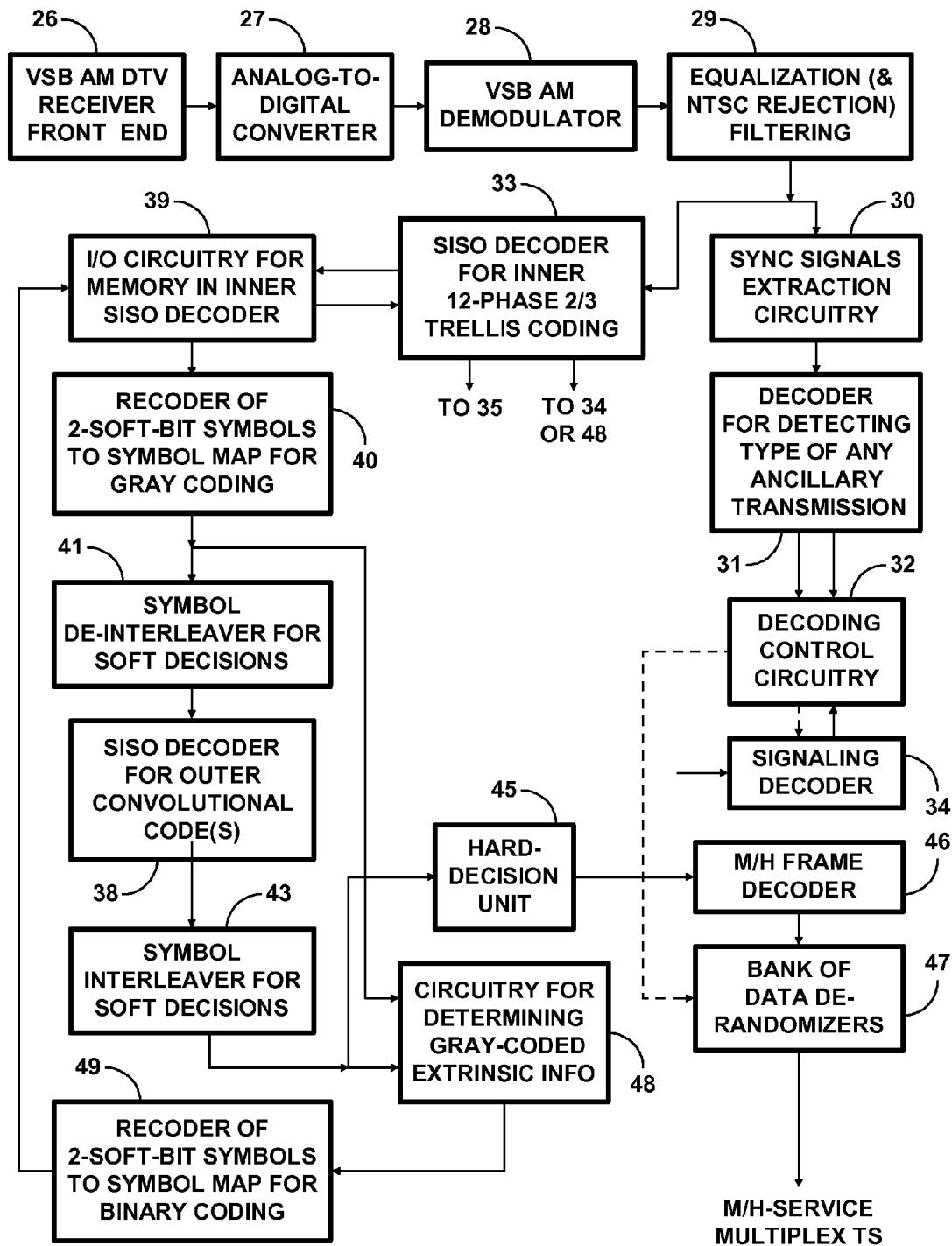
FIG. 25 is a schematic diagram of modified FIG. 14 receiver apparatus suited for receiving M/H-service signals transmitted by the FIG. 1 or FIG. 10 transmitter apparatus as modified to use the FIG. 22 block processor, according to an exemplary embodiment of the present application.

FIG. 25 is a schematic diagram of modified FIG. 14 receiver apparatus suited for receiving M/H-service signals from the transmitter apparatus of FIG. 1 or 4 as modified to use the FIG. 22 block processor. The hard-decision unit 45 is connected for receiving input signal supplied as response from the symbol interleaver 43, avoiding the need for the bit de-interleaver 55 following the hard-decision unit 45.

Figure 26:
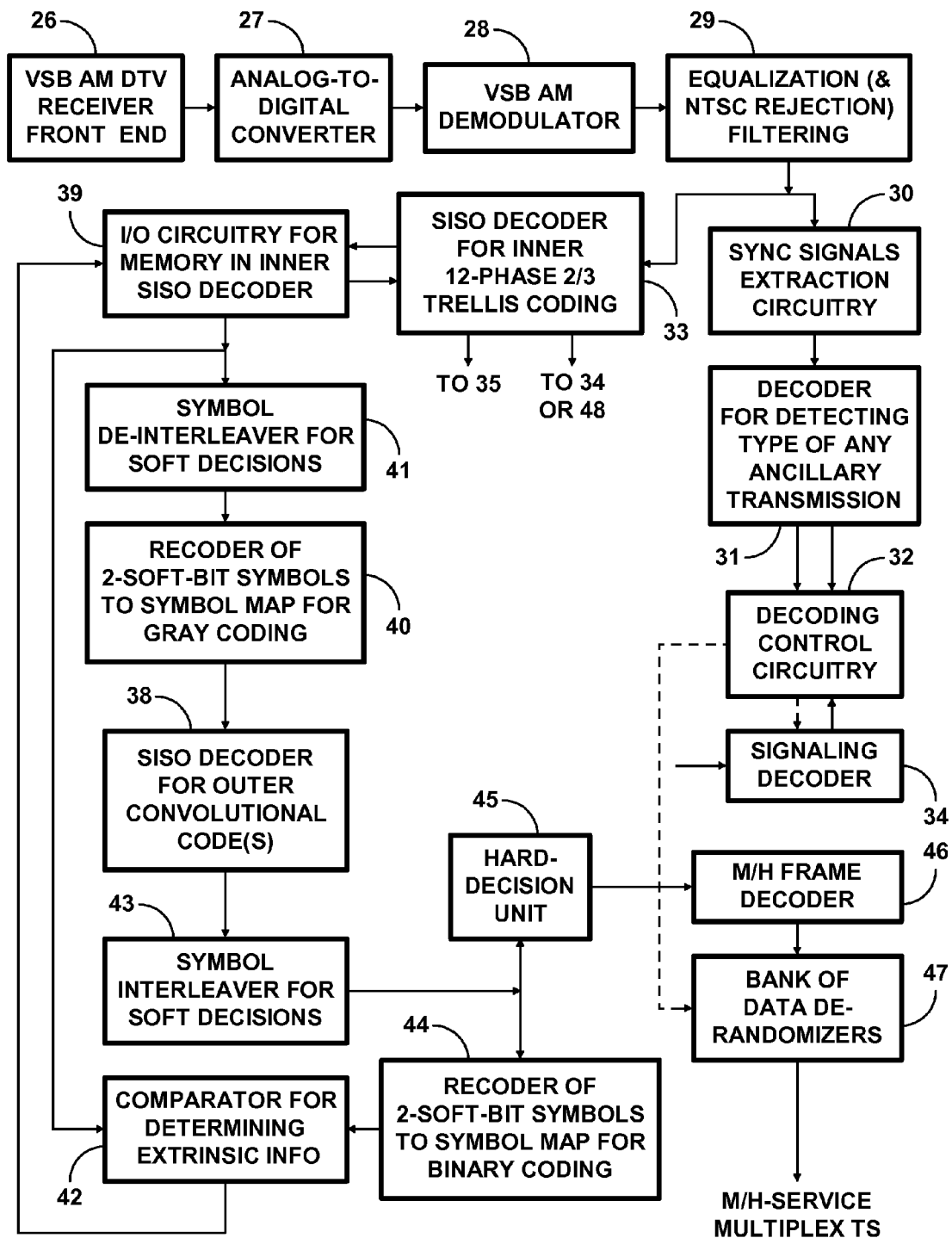
FIG. 26 is a schematic diagram of modified FIG. 17 receiver apparatus suited for receiving M/H-service signals from the modified transmitter apparatus of FIG. 1 or of FIG. 10, according to an exemplary embodiment of the present application.

FIG. 26 is a schematic diagram of modified FIG. 17 receiver apparatus suited for receiving M/H-service signals from the transmitter apparatus of FIG. 1 or 4 as modified to use the FIG. 22 block processor. The hard-decision unit 45 is connected for receiving input signal supplied as response from the symbol interleaver 43, avoiding the need for the bit de-interleaver 55 following the hard-decision unit 45.

The interleaver in the block processor of an M/H type of transmitter apparatus (e.g., in the block processor 7 of the FIG. 1 or FIG. 10 transmitter apparatus) provides 2-bit symbol by 2-bit symbol interleaving prior to anti-Gray coding. In the receiver apparatuses shown in FIGS. 11-16, 24 and 25 the de-interleaver 41 is connected after the symbol re-coder 40 for Gray coding soft decisions from the trellis decoder 33. If only receiver apparatuses of the sort shown in FIGS. 11-16, 24 and 25 are used, the de-interleaver 41 and the interleaver in the block processor of the transmitter apparatus could be alternatively designed to implement bit-by-bit interleaving, rather than symbol-by-symbol interleaving. In the receiver apparatuses shown in FIGS. 17-21 and 26 the de-interleaver 41 is connected before the symbol re-coder 40 for Gray coding soft decisions from the trellis decoder 33. Therefore, the de-interleaver 41 must provide 2-bit symbol by 2-bit symbol de-interleaving to preserve the relationship of the two soft bits in each soft decision regarding a respective symbol. Preservation of this relationship is essential for correct input signal of the symbol re-coder 40.

In an alternative design of the DTV transmitter apparatus the anti-Gray coding precedes 2-bit symbol by 2-bit symbol interleaving. If only receiver apparatuses of the sort shown in FIGS. 17-21 and 26 are used, the de-interleaver in the receiver and the interleaver in the block processor of this alternative-design transmitter apparatus could be modified to implement bit-by-bit interleaving. In the receiver apparatuses shown in FIGS. 11-16, 24 and 25 modification of the interleaver in the block processor of this alternative-design transmitter apparatus would disrupt the relationship of the two soft bits in each soft decision used for addressing the symbol re-coder 40, however.

If the SCCC employs 2-bit symbol by 2-bit symbol interleaving, the order in which the interleaving and anti-Gray coding of the 2-bit symbols is performed in the transmitter is of no appreciable consequence. Receiver apparatuses of the sort shown in FIGS. 17-21 and 26 in which the symbol de-interleaver 41 precedes the symbol re-coder 40 for re-coding soft decisions have the advantage that symbol de-interleaving can use random-access memory that is already included within the inner SISO decoder 33 in most designs. Symbol de-interleaving can be implemented simply by applying appropriate read addressing to this memory. The FIG. 17 and FIG. 26 receiver apparatuses have the further advantage that the symbol interleaver 43 can use random-access memory that is already included within the outer SISO decoder 38 in most designs. Symbol interleaving can be implemented simply by applying appropriate read addressing to this memory.

FIGS. 27A and 27B are tables illustrating the nature of the contents of read-only memory used for re-coding symbols from binary-code mapping to Gray-code mapping, or vice versa. The re-coding is performed in accordance with re-coding table 1 shown in FIG. 2. The symbol re-coder ROM used for this illustration has 6-bit-wide input addressing of sixty-four addressed storage locations, each storing a respective 6-bit-wide response. Each 6-bit-wide input address is composed of two "soft" bits, each consisting of a respective set of three bits, the initial bit being a "hard" bit and the final two bits expressing the probability of the preceding "hard" bit being correct. The highest probability of a ZERO "hard" bit being correct is expressed by the final bits being 00. A smaller probability of the ZERO "hard" bit being correct is expressed by the final bits being 01. A still smaller probability of the ZERO "hard" bit being correct is expressed by the final bits being 10. The smallest probability of the ZERO "hard" bit being correct is expressed by the final bits being 11. The smallest probability of a ONE "hard" bit being correct is expressed by the final bits being 00. A larger probability of the ONE "hard" bit being correct is expressed by the final bits being 01. A still larger probability of the ONE "hard" bit being correct is expressed by the final bits being 10. The highest probability of the ONE "hard" bit being correct is expressed by the final bits being 11. Each 6-bit-wide response stored in the symbol re-coder ROM is composed of two "soft" bits, each consisting of a respective set of three bits, the initial bit being a "hard" bit and the final two bits expressing the probability of the preceding "hard" bit being correct. The final two bits express the probability of the preceding "hard" bit being correct in each "soft" bit of the response of the symbol re-coder ROM in the same way as in each "soft" bit of the input address of the symbol re-coder ROM.

The inventor made the following observations from the symbol re-coder ROM contents tabulated in FIGS. 27A and 27B. The initial one of the two soft bits of the response supplied from the symbol re-coder ROM is identical to the initial one of the two soft bits of the input address supplied to the symbol re-coder ROM. If the "hard" bit of the initial soft bit of the input address supplied to the symbol re-coder ROM is a ZERO, the final one of the two soft bits of the response from the symbol re-coder ROM is identical to the final one of the two soft bits of its input address. If the "hard" bit of the initial soft bit of the input address supplied to the symbol re-coder ROM is a ONE, however, the final soft bit of the response from the symbol re-coder ROM ones-complements the final soft bit of its input address. These observations led the inventor to investigate whether logic circuitry might be used to replace the symbol re-coder ROM. The inventor speculated that logic circuitry might usefully replace the more sizable symbol re-coder ROMs likely to be needed in actual practice, in which soft bits consisting of as many as eight or so simple bits were likely to be required.

FIG. 28 shows simple logic circuitry that can be used instead of ROM for re-coding 2-soft-bit symbols from a mapping for binary-code modulation to a mapping for reflected-binary-code modulation—i.e., for Gray-code modulation—or vice versa. Each of the soft bits in the 2-soft-bit symbols of both the binary and reflected-binary codes is presumed to consist of eight bits altogether, which presumption is consistent with what is expected to be used in actual practice. The two "hard" bits in the 2-soft-bit symbols of the reflected-binary code are presumed to be those for the preferred type of re-coding tabulated in FIG. 2. Positive-going amplitude modulation of the 8VSB AM signal is associated with the re-coded Z-sub-2 "hard" bit being a logic ONE, and negative-going amplitude modulation of the 8VSB AM signal is associated with the re-coded Z-sub-2 bit "hard" being a logic ZERO. Irrespective of the sense of modulation, lesser amplitude modulation of the 8VSB AM signal is associated with the re-coded Z-sub-1 "hard" bit being a logic ONE, and greater amplitude modulation of the 8VSB AM signal is associated with the re-coded Z-sub-1 "hard" bit being a logic ZERO. The remaining bits of each soft bit express the probability of the preceding "hard" bit being correct using an expansion of the scheme described in connection with FIGS. 27A and 27B.

The initial one of the two soft bits in the symbol supplied to the symbol re-coder 60 shown in FIG. 28, is passed through the symbol re-coder 60 without change to provide the initial one of the two soft bits in a respective symbol of the symbol re-coder 60 response. Each of the component eight simple bits in the final one of the two soft bits in the symbol supplied to the symbol re-coder 60 is supplied to a first of two input connections of a respective one of exclusive-OR gates 61, 62, 63, 64, 65, 66, 67 and 68 included within the symbol re-coder 60. The component bit of the initial one of the two soft bits in the symbol supplied to the symbol re-coder 60 that is variously referred to as its sign bit or "hard" bit is applied to the respective second input connections of the exclusive-OR gates 61, 62, 63, 64, 65, 66, 67 and 68. The final one of the two soft bits in each symbol of the symbol re-coder 60 response is supplied from via output connections from the exclusive-OR gates 61, 62, 63, 64, 65, 66, 67 and 68.

In practice, constructions of the receivers shown in FIGS. 11-21 and 24-26 are preferred in which the symbol re-coder 40 is constructed per FIG. 28, rather than using a ROM.

Preferably, but not necessarily, then, the symbol re-coder 44 in the receivers shown in FIGS. 11-13, 17, 18, 24 and 26 is also constructed per FIG. 28, rather than using a ROM. Preferably, but not necessarily, then, the symbol re-coder 49 in the receivers shown in FIGS. 14, 15, 16, 20, 21 and 25 is also constructed per FIG. 28, rather than using a ROM.

FIG. 29 shows a re-coder 80 composed of simple logic circuitry, which is designed for re-coding as tabulated in FIG. 3. Positive-going amplitude modulation of the 8VSB AM signal is associated with the re-coded Z-sub-2 "hard" bit being a logic ONE, and negative-going amplitude modulation of the 8VSB AM signal is associated with the re-coded Z-sub-2 bit "hard" being a logic ZERO. Irrespective of the sense of modulation, lesser amplitude modulation of the 8VSB AM signal is associated with the re-coded Z-sub-1 "hard" bit being a logic ZERO, and greater amplitude modulation of the 8VSB AM signal is associated with the re-coded Z-sub-1 "hard" bit being a logic ONE. The remaining bits of each soft bit express the probability of the preceding "hard" bit being correct. The symbol re-coder 40 can be constructed similarly to the re-coder 80 for re-coding 2-soft-bit symbols from a mapping for binary-code modulation to a mapping for reflected-binary-code modulation rather than using a ROM. Then, the symbol re-coders 44 and 49, used for re-coding 2-soft-bit symbols from a mapping for reflected-binary-code modulation to a mapping for binary-code modulation, are preferably but not necessarily, constructed similarly to the symbol re-coder 80, rather than using the ROM.

The initial one of the two soft bits in the symbol supplied to the symbol re-coder 80 shown in FIG. 29, is passed through the symbol re-coder 80 without change to provide the initial one of the two soft bits in a respective symbol of the symbol re-coder 80 response. Each of the component eight simple bits in the final one of the two soft bits in the symbol supplied to the symbol re-coder 80 is supplied to a first of two input connections of a respective one of exclusive-NOR gates 81, 82, 83, 84, 85, 86, 87 and 88 included within the symbol re-coder 80. The component bit of the initial one of the two soft bits in the symbol supplied to the symbol re-coder 80 that is variously referred to as its sign bit or "hard" bit is applied to the respective second input connections of the exclusive-NOR gates 81, 82, 83, 84, 85, 86, 87 and 88. The final one of the two soft bits in each symbol of the re-coder 80 response is supplied from via output connections from the exclusive-NOR gates 81, 82, 83, 84, 85, 86, 87 and 88.

The re-coder 60 can be used for re-coding as tabulated in FIG. 4. The positions of the soft bits in each symbol are interchanged in the input signal before applying it to the re-coder 60 for re-coding per the FIG. 4 tabulation. The re-coder 80 can be used for re-coding as tabulated in FIG. 5. The positions of the soft bits in each symbol are interchanged in the input signal before applying it to the re-coder 80 for re-coding per the FIG. 5 tabulation. Digital logic circuitry can be devised for re-coding as tabulated in each of FIGS. 6, 7, 8 and 9, but will be more complex than the described digital logic circuitry for re-coding as tabulated in each of FIGS. 2, 3, 4 and 5.

If the FIG. 10 transmitter apparatus is employed, the signaling encoder 34 shown in FIGS. 11-21 and 24-26 will include an initial symbol re-coder for receiving soft decisions from the inner SISO decoder 33. This symbol re-coder will convert the soft decisions from the inner SISO decoder 33 to appear as though they were transmitted using Gray-coded modulation.

Considerable amounts of any one of the receiver apparatuses described supra may be constructed using integrated circuitry comprising suitably programmed microcomputer circuitry that is the operating equivalent of the structures shown in that receiver apparatus. Accordingly, the claims which follow, although directed to structures employing special-purpose circuit elements in order to further definiteness in claiming, should be interpreted to include within their scope of protection those structures employing general-purpose circuit elements that are operating equivalents.

The forgoing embodiments of the invention are exemplary and are not to be construed as limiting the present invention. The current teachings can be readily applied to other systems transmitting concatenated coding using binary-coded modulation. The description of the invention is intended to be illustrative, and not to limit the scope of the claims. Many alternatives, modifications, and variations are apt to become apparent to those skilled in the art when acquainted with the teachings of this disclosure. Particularly, forms of symbol re-coder other than those specifically described may be used for implementing the fundamental precepts of the invention.

In the claims which follow, the word "said" rather than the word "the" is used to indicate the existence of an antecedent basis for a term having being provided earlier in the claims. The word "the" is used for purposes other than to indicate the existence of an antecedent basis for a term having being provided earlier in the claims, the usage of the word "the" for other purposes being consistent with normal grammar in the American English language.

What is claimed is:

1. A receiver for vestigial-sideband amplitude-modulation (VSB AM) signal, successive symbols of the modulating signal for said VSB AM signal defining a digital signal in accordance with an eight-level symbol alphabet superposed on a pedestal, said digital signal composed of successive frames each composed of two respective fields of digital-signal symbols, each said field composed of a respective initial segment of 832 digital-signal symbols succeeded by respective 312 consecutive further segments of 832 digital-signal symbols apiece, the four initial digital-signal symbols of each of said segments of 832 digital-signal symbols being a prescribed data segment synchronizing signal sequence, the final 828 digital-signal symbols of said 312 further segments of each said field of digital-signal symbols having prescribed $\frac{2}{3}$ trellis coding, three-bit symbols of said $\frac{2}{3}$ trellis coding being mapped to said eight-level symbol alphabet in such manner as to generate binary-coded modulation superposed on said pedestal, at least some said respective 312 further segments of said fields of digital-signal symbols including within selected portions thereof digital-signal symbols generated by said prescribed $\frac{2}{3}$ trellis coding responding to mobile/handheld (M/H)-service data that has been randomized and encoded with an outer coding, two-bit symbols of which outer coding are subjected to symbol interleaving and anti-Gray-coding before being $\frac{2}{3}$ trellis coded, said receiver comprising:

apparatus for receiving a selected vestigial-sideband amplitude-modulation signal and converting it to a baseband digital signal including successive reproduced eight-level symbols of 12-phase $\frac{2}{3}$ trellis-coded baseband digital signal;

an inner soft-input/soft-output (SISO) decoder connected for trellis decoding said successive reproduced eight-level symbols of 12-phase $\frac{2}{3}$ trellis-coded baseband digital signal to generate an inner decoder response composed of soft decisions concerning two-bit symbols previously encoded within said eight-level symbols, each soft decision composed of a respective hard decision as to the value of each of said two-bit symbols and an accompanying indication of the probability of that said respective two-bit symbol being correct;
a symbol processor for generating a succession of processed soft decisions by symbol de-interleaving selected successive ones of said soft decisions generated by said inner decoder and by re-coding said selected successive ones of said soft decisions generated by said inner decoder so as to appear as though having been extracted from a Gray-coded modulating signal, said selected successive ones of said soft decisions generated by said inner decoder being those that concern anti-Gray-coded two-bit symbols of symbol-interleaved M/H-service data encoded with said outer coding, each processed soft decision being supplied by said symbol processor as a respective symbol composed of two soft bits; and
an outer soft-input/soft-output (SISO) decoder for said M/H-service data encoded with an outer coding connected for receiving said processed soft decisions supplied from said symbol processor and further decoding said processed soft decisions as so received to generate soft decisions concerning two-soft-bit symbols of said M/H-service data.

2. The claim 1 receiver, wherein said symbol processor comprises:
a first symbol re-coder for re-coding ones of said soft decisions generated by said inner SISO decoder that concern anti-Gray-coded two-bit symbols of symbol-interleaved M/H-service data encoded with said outer coding, thus to generate soft decisions regarding two-bit symbols of symbol-interleaved M/H-service data encoded with said outer coding; and
a symbol de-interleaver connected for receiving said soft decisions regarding two-bit symbols of symbol-interleaved M/H-service data encoded with said outer coding and complementing said symbol interleaving to generate said processed soft decisions of said symbol processor for reception by said outer SISO decoder as the input signal thereof.

3. The claim 2 receiver, further comprising:
a symbol interleaver connected for receiving said soft decisions concerning two-bit symbols of said M/H-service data from said outer SISO decoder and symbol-interleaving successive ones of them to generate symbol-interleaved soft decisions of a symbol-interleaved turbo feedback signal;
a second symbol re-coder connected for re-coding said symbol-interleaved soft decisions in said symbol-interleaved turbo feedback signal to generate symbol-interleaved soft decisions of an anti-Gray-coded symbol-interleaved turbo feedback signal; and
a comparator for determining anti-Gray-coded extrinsic information to modify operation of said inner soft-input/soft-output decoder, said comparator being connected to determine said anti-Gray-coded extrinsic information by comparing said anti-Gray-coded symbol-interleaved turbo feedback signal with said inner SISO decoder response.

4. The claim 3 receiver, further comprising:
a hard-decision unit connected for generating successive hard decisions as to bits of said M/H-service data responsive to portions of said soft decisions concerning two-bit symbols of said M/H-service data generated by said outer SISO decoder;
an M/H Frame decoder connected for receiving as an input signal thereto said successive hard decisions as to bits of said M/H-service data and for responding to supply data-randomized transport stream packets; and
a data de-randomizer connected for receiving data-randomized transport stream packets supplied from said M/H Frame decoder and de-randomizing them to supply restored transport stream packets.

5. The claim 3 receiver as adapted for receiving M/H-service data that has been bit de-interleaved in accordance with a prescribed bit de-interleaving pattern after having been randomized but before having been encoded with said outer coding and subjected to symbol interleaving, said receiver further comprising:
a hard-decision unit connected for generating successive hard decisions as to bits of said M/H-service data responsive to portions of said soft decisions concerning two-bit symbols of said M/H-service data generated by said outer SISO decoder;
a bit interleaver for interleaving said successive hard decisions in accordance with a bit-interleaving pattern complementary to said bit de-interleaving pattern, thereby generating successive bit-interleaved hard decisions;
an M/H Frame decoder connected for receiving as an input signal thereto said successive bit-interleaved hard decisions and for responding to supply data-randomized transport stream packets; and
a data de-randomizer connected for receiving data-randomized transport stream packets supplied from said M/H Frame decoder and de-randomizing them to supply restored transport stream packets.

6. The claim 3 receiver as adapted for receiving M/H-service data that has been bit de-interleaved in accordance with a prescribed bit de-interleaving pattern after having been randomized, but before having been encoded with said outer coding and subjected to symbol interleaving, said receiver further comprising:
a hard-decision unit connected for generating successive hard decisions as to bits of said M/H-service data responsive to portions of said symbol-interleaved soft decisions generated by said symbol interleaver;
an M/H Frame decoder connected for receiving as an input signal thereto said successive hard decisions as to bits of said M/H-service data and for responding to supply data-randomized transport stream packets; and
a data de-randomizer connected for receiving data-randomized transport stream packets supplied from said M/H Frame decoder and de-randomizing them to supply restored transport stream packets.

7. The claim 2 receiver, further comprising:
a second symbol re-coder connected for generating soft decisions concerning two-bit symbols of an anti-Gray-coded turbo feedback signal by re-coding said soft decisions concerning two-bit symbols of said M/H-service data supplied from said outer SISO decoder;
a symbol interleaver connected for receiving said soft decisions concerning two-bit symbols of said anti-Gray-coded turbo feedback signal and symbol-interleaving successive ones of them to generate symbol-interleaved soft decisions in a symbol-interleaved anti-Gray-coded turbo feedback signal; and
a comparator for determining anti-Gray-coded extrinsic information to modify operation of said inner SISO decoder, said comparator being connected to determine said anti-Gray-coded extrinsic information by comparing said symbol-interleaved anti-Gray-coded turbo feedback signal with said inner decoder response.

8. The claim 7 receiver, further comprising:
a hard-decision unit connected for generating successive hard decisions as to bits of said M/H-service data responsive to portions of said soft decisions concerning two-bit symbols of said M/H-service data generated by said outer SISO decoder;

an M/H Frame decoder connected for receiving as an input signal thereto said successive hard decisions as to bits of said M/H-service data and for responding to supply data-randomized transport stream packets; and a data de-randomizer connected for receiving data-randomized transport stream packets supplied from said M/H Frame decoder and de-randomizing them to supply restored transport stream packets.

9. The claim 7 receiver as adapted for receiving M/H-service data that has been bit de-interleaved in accordance with a prescribed bit de-interleaving pattern after having been randomized, but before having been encoded with said outer coding and subjected to symbol interleaving, said receiver further comprising:

a hard-decision unit connected for generating successive hard decisions as to bits of said M/H-service data responsive to portions of said soft decisions concerning two-bit symbols of said M/H-service data generated by said outer SISO decoder;

a bit interleaver for interleaving said successive hard decisions in accordance with a bit-interleaving pattern complementary to said bit de-interleaving pattern, thereby generating successive bit-interleaved hard decisions;

an M/H Frame decoder connected for receiving as an input signal thereto said successive bit-interleaved hard decisions and for responding to supply data-randomized transport stream packets; and a data de-randomizer connected for receiving data-randomized transport stream packets supplied from said M/H Frame decoder and de-randomizing them to supply restored transport stream packets.

10. The claim 2 receiver, further comprising:

a symbol interleaver connected for receiving said soft decisions concerning two-bit symbols of said M/H-service data from said outer SISO decoder and symbol-interleaving successive ones of them to generate successive symbol-interleaved soft decisions within a symbol-interleaved turbo feedback signal;

a comparator for determining extrinsic information by comparing soft decisions in said symbol-interleaved turbo feedback signal with said soft decisions regarding two-bit symbols of symbol-interleaved M/H-service data encoded with said outer coding as supplied to said symbol de-interleaver; and a second symbol re-coder connected for re-coding two-bit symbols of said extrinsic information to generate anti-Gray-coded extrinsic information supplied to said inner SISO decoder to modify its operation.

11. The claim 10 receiver, further comprising:

a hard-decision unit connected for generating successive hard decisions as to bits of said M/H-service data responsive to portions of said soft decisions concerning two-bit symbols of said M/H-service data generated by said outer SISO decoder;

an M/H Frame decoder connected for receiving as an input signal thereto said successive hard decisions as to bits of said M/H-service data and for responding to supply data-randomized transport stream packets; and a data de-randomizer connected for receiving data-randomized transport stream packets supplied from said M/H Frame decoder and de-randomizing them to supply restored transport stream packets.

12. The claim 10 receiver as adapted for receiving M/H-service data that has been bit de-interleaved in accordance with a prescribed bit de-interleaving pattern after having been randomized, but before having been encoded with said outer coding and subjected to symbol interleaving, said receiver further comprising:

a hard-decision unit connected for generating successive hard decisions as to bits of said M/H-service data responsive to portions of said soft decisions concerning two-bit symbols of said M/H-service data generated by said outer SISO decoder;

a bit interleaver for interleaving said successive hard decisions in accordance with a bit-interleaving pattern complementary to said bit de-interleaving pattern, thereby generating successive bit-interleaved hard decisions;

an M/H Frame decoder connected for receiving as an input signal thereto said successive bit-interleaved hard decisions and for responding to supply data-randomized transport stream packets; and a data de-randomizer connected for receiving data-randomized transport stream packets supplied from said M/H Frame decoder and de-randomizing them to supply restored transport stream packets.

13. The claim 10 receiver as adapted for receiving M/H-service data that has been bit de-interleaved in accordance with a prescribed bit de-interleaving pattern after having been randomized, but before having been encoded with said outer coding and subjected to symbol interleaving, said receiver further comprising:

a hard-decision unit connected for generating successive hard decisions as to bits of said M/H-service data responsive to portions of said symbol-interleaved soft decisions generated by said symbol interleaver;

an M/H Frame decoder connected for receiving as an input signal thereto said successive hard decisions and for responding to supply data-randomized transport stream packets; and a data de-randomizer connected for receiving data-randomized transport stream packets supplied from said M/H Frame decoder and de-randomizing them to supply restored transport stream packets.

14. The claim 2 receiver, further comprising:

a comparator for determining de-interleaved extrinsic information, said comparator being connected to determine said de-interleaved extrinsic information by comparing soft decisions regarding two-bit symbols of M/H-service data encoded with said outer coding as supplied from said symbol de-interleaver with said soft decisions regarding two-bit symbols of M/H-service data encoded with said outer coding as supplied from said outer SISO decoder;

a symbol interleaver connected for receiving said de-interleaved extrinsic information as determined by said comparator and symbol-interleaving successive two-soft-bit symbols of said de-interleaved extrinsic information to generate successive two-soft-bit symbols of symbol-interleaved extrinsic information; and a second symbol re-coder connected for being addressed by at least successive two-soft-bit data symbol portions of said symbol-interleaved extrinsic information, said second symbol re-coder anti-Gray coding said successive two-soft-bit symbols of said symbol-interleaved extrinsic information to generate successive two-soft-bit symbols of anti-Gray-coded extrinsic information supplied to said inner SISO decoder to modify its operation.

15. The claim 14 receiver, further comprising:
a hard-decision unit connected for generating successive hard decisions as to bits of said M/H-service data responsive to portions of said soft decisions concerning two-bit symbols of said M/H-service data generated by said outer SISO decoder;
an M/H Frame decoder connected for receiving as an input signal thereto said successive hard decisions as to bits of said M/H-service data and for responding to supply data-randomized transport stream packets; and
a data de-randomizer connected for receiving data-randomized transport stream packets supplied from said M/H Frame decoder and de-randomizing them to supply restored transport stream packets.

16. The claim 14 receiver as adapted for receiving M/H-service data that has been bit de-interleaved in accordance with a prescribed bit de-interleaving pattern after having been randomized, but before having been encoded with said outer coding and subjected to symbol interleaving, said receiver further comprising:
a hard-decision unit connected for generating successive hard decisions as to bits of said M/H-service data responsive to portions of said soft decisions concerning two-bit symbols of said M/H-service data generated by said outer SISO decoder;
a bit interleaver for interleaving said successive hard decisions in accordance with a bit-interleaving pattern complementary to said bit de-interleaving pattern, thereby generating successive bit-interleaved hard decisions;
an M/H Frame decoder connected for receiving as an input signal thereto said successive bit-interleaved hard decisions and for responding to supply data-randomized transport stream packets; and
a data de-randomizer connected for receiving data-randomized transport stream packets supplied from said M/H Frame decoder and de-randomizing them to supply restored transport stream packets.

17. The claim 2 receiver, further comprising:
a comparator for determining de-interleaved extrinsic information, said comparator being connected to determine two-soft-bit symbols of said de-interleaved extrinsic information by comparing soft decisions regarding two-bit symbols of M/H-service data encoded with said outer coding as supplied from said symbol de-interleaver with said soft decisions regarding two-bit symbols of M/H-service data encoded with said outer coding as supplied from said outer SISO decoder;
a second symbol re-coder connected for being addressed by two-soft-bit symbols of said de-interleaved extrinsic information, said second symbol re-coder anti-Gray coding each respective two-soft-bit symbol of said de-interleaved extrinsic information to generate a respective two-soft-bit symbol of anti-Gray-coded de-interleaved extrinsic information; and
a symbol interleaver for receiving successive said two-soft-bit symbols of anti-Gray-coded de-interleaved extrinsic information and symbol-interleaving successive ones of them to generate two-soft-bit symbols of symbol-interleaved anti-Gray-coded extrinsic information supplied to said inner SISO decoder to modify its operation.

18. The claim 17 receiver, further comprising:
a hard-decision unit connected for generating successive hard decisions as to bits of said M/H-service data responsive to portions of said soft decisions concerning two-bit symbols of said M/H-service data generated by said outer SISO decoder;
an M/H Frame decoder connected for receiving as an input signal thereto said successive hard decisions as to bits of said M/H-service data and for responding to supply data-randomized transport stream packets; and
a data de-randomizer connected for receiving data-randomized transport stream packets supplied from said M/H Frame decoder and de-randomizing them to supply restored transport stream packets.

19. The claim 17 receiver as adapted for receiving M/H-service data that has been bit de-interleaved in accordance with a prescribed bit de-interleaving pattern after having been randomized, but before having been encoded with said outer coding and subjected to symbol interleaving, said receiver further comprising:
a hard-decision unit connected for generating successive hard decisions as to bits of said M/H-service data responsive to portions of said soft decisions concerning two-bit symbols of said M/H-service data generated by said outer SISO decoder;
a bit interleaver for interleaving said successive hard decisions in accordance with a bit-interleaving pattern complementary to said bit de-interleaving pattern, thereby generating successive bit-interleaved hard decisions;
an M/H Frame decoder connected for receiving as an input signal thereto said successive bit-interleaved hard decisions and for responding to supply data-randomized transport stream packets; and
a data de-randomizer connected for receiving data-randomized transport stream packets supplied from said M/H Frame decoder and de-randomizing them to supply restored transport stream packets.

20. The claim 1 receiver, wherein said symbol processor comprises:
a symbol de-interleaver connected for receiving said soft decisions generated by said inner SISO decoder and complementing said symbol interleaving to supply de-interleaved soft decisions; and
a first symbol re-coder connected for re-coding said de-interleaved soft decisions supplied from said symbol de-interleaver to generate said processed soft decisions of said symbol processor for reception by said outer SISO decoder as input signal thereof.

21. The claim 20 receiver, further comprising:
a symbol interleaver connected for receiving said soft decisions concerning two-bit symbols of said M/H-service data from said outer SISO decoder and symbol-interleaving successive ones of them to generate symbol-interleaved soft decisions of a symbol-interleaved turbo feedback signal;
a second symbol re-coder connected for re-coding said symbol-interleaved soft decisions in said symbol-interleaved turbo feedback signal to generate symbol-interleaved soft decisions of an anti-Gray-coded symbol-interleaved turbo feedback signal; and
a comparator for determining anti-Gray-coded extrinsic information to modify operation of said inner soft-input/soft-output decoder, said comparator being connected to determine said anti-Gray-coded extrinsic information by comparing said anti-Gray-coded symbol-interleaved turbo feedback signal with said inner SISO decoder response.

22. The claim 21 receiver, further comprising:
- a hard-decision unit connected for generating successive hard decisions as to bits of said M/H-service data responsive to portions of said soft decisions concerning two-bit symbols of said M/H-service data generated by said outer SISO decoder;
- an M/H Frame decoder connected for receiving as an input signal thereto said successive hard decisions as to bits of said M/H-service data and for responding to supply data-randomized transport stream packets; and
- a data de-randomizer connected for receiving data-randomized transport stream packets supplied from said M/H Frame decoder and de-randomizing them to supply restored transport stream packets.

23. The claim 21 receiver as adapted for receiving M/H-service data that has been bit de-interleaved in accordance with a prescribed bit de-interleaving pattern after having been randomized, but before having been encoded with said outer coding and subjected to symbol interleaving, said receiver further comprising:
- a hard-decision unit connected for generating successive hard decisions as to bits of said M/H-service data responsive to portions of said soft decisions concerning two-bit symbols of said M/H-service data generated by said outer SISO decoder;
- a bit interleaver for interleaving said successive hard decisions in accordance with a bit-interleaving pattern complementary to said bit de-interleaving pattern, thereby generating successive bit-interleaved hard decisions;
- an M/H Frame decoder connected for receiving as an input signal thereto said successive bit-interleaved hard decisions and for responding to supply data-randomized transport stream packets; and
- a data de-randomizer connected for receiving data-randomized transport stream packets supplied from said M/H Frame decoder and de-randomizing them to supply restored transport stream packets.

24. The claim 21 receiver as adapted for receiving M/H-service data that has been bit de-interleaved in accordance with a prescribed bit de-interleaving pattern after having been randomized, but before having been encoded with said outer coding and subjected to symbol interleaving, said receiver further comprising:
- a hard-decision unit connected for generating successive hard decisions as to bits of said M/H-service data responsive to portions of said symbol-interleaved soft decisions generated by said symbol interleaver;
- an M/H Frame decoder connected for receiving as an input signal thereto said successive hard decisions as to bits of said M/H-service data and for responding to supply data-randomized transport stream packets; and
- a data de-randomizer connected for receiving data-randomized transport stream packets supplied from said M/H Frame decoder and de-randomizing them to supply restored transport stream packets.

25. The claim 20 receiver, further comprising:
- a second symbol re-coder connected for generating soft decisions concerning two-bit symbols of an anti-Gray-coded turbo feedback signal by re-coding said soft decisions concerning two-bit symbols of said M/H-service data supplied from said outer SISO decoder;
- a symbol interleaver connected for receiving said soft decisions concerning two-bit symbols of said anti-Gray-coded turbo feedback signal and symbol-interleaving successive ones of them to generate symbol-interleaved soft decisions in a symbol-interleaved anti-Gray-coded turbo feedback signal; and
- a comparator for determining anti-Gray-coded extrinsic information to modify operation of said inner SISO decoder, said comparator being connected to determine said anti-Gray-coded extrinsic information by comparing said symbol-interleaved anti-Gray-coded turbo feedback signal with said inner decoder response.

26. The claim 25 receiver, further comprising:
- a hard-decision unit connected for generating successive hard decisions as to bits of said M/H-service data responsive to portions of said soft decisions concerning two-bit symbols of said M/H-service data generated by said outer SISO decoder;
- an M/H Frame decoder connected for receiving as an input signal thereto said successive hard decisions as to bits of said M/H-service data and for responding to supply data-randomized transport stream packets; and
- a data de-randomizer connected for receiving data-randomized transport stream packets supplied from said M/H Frame decoder and de-randomizing them to supply restored transport stream packets.

27. The claim 25 receiver as adapted for receiving M/H-service data that has been bit de-interleaved in accordance with a prescribed bit de-interleaving pattern after having been randomized, but before having been encoded with said outer coding and subjected to symbol interleaving, said receiver further comprising:
- a hard-decision unit connected for generating successive hard decisions as to bits of said M/H-service data responsive to portions of said soft decisions concerning two-bit symbols of said M/H-service data generated by said outer SISO decoder;
- a bit interleaver for interleaving said successive hard decisions in accordance with a bit-interleaving pattern complementary to said bit de-interleaving pattern, thereby generating successive bit-interleaved hard decisions;
- an M/H Frame decoder connected for receiving as an input signal thereto said successive bit-interleaved hard decisions and for responding to supply data-randomized transport stream packets; and
- a data de-randomizer connected for receiving data-randomized transport stream packets supplied from said M/H Frame decoder and de-randomizing them to supply restored transport stream packets.

28. The claim 20 receiver, further comprising:
- a second symbol re-coder connected for generating soft decisions concerning two-bit symbols of an anti-Gray-coded turbo feedback signal by re-coding said soft decisions concerning two-bit symbols of said M/H-service data supplied from said outer SISO decoder;
- a comparator for determining de-interleaved anti-Gray-coded extrinsic information, said comparator being connected to determine successive two-soft-bit symbols of said de-interleaved anti-Gray-coded extrinsic information by comparing successive two-soft-bit symbols of said anti-Gray-coded turbo feedback signal with two-soft-bit symbols of M/H-service data encoded with said outer coding as supplied from said symbol de-interleaver; and
- a symbol interleaver connected for receiving successive said successive two-soft-bit symbols of said de-interleaved anti-Gray-coded extrinsic information from said comparator and symbol-interleaving them to generate successive two-soft-bit symbols of symbol-interleaved anti-Gray-coded extrinsic information supplied to said inner SISO decoder to modify its operation.

29. The claim 28 receiver, further comprising:
a hard-decision unit connected for generating successive hard decisions as to bits of said M/H-service data responsive to portions of said soft decisions concerning two-bit symbols of said M/H-service data generated by said outer SISO decoder;
an M/H Frame decoder connected for receiving as an input signal thereto said successive hard decisions as to bits of said M/H-service data and for responding to supply data-randomized transport stream packets; and
a data de-randomizer connected for receiving data-randomized transport stream packets supplied from said M/H Frame decoder and de-randomizing them to supply restored transport stream packets.

30. The claim 28 receiver as adapted for receiving M/H-service data that has been bit de-interleaved in accordance with a prescribed bit de-interleaving pattern after having been randomized, but before having been encoded with said outer coding and subjected to symbol interleaving, said receiver further comprising:
a hard-decision unit connected for generating successive hard decisions as to bits of said M/H-service data responsive to portions of said soft decisions concerning two-bit symbols of said M/H-service data generated by said outer SISO decoder;
a bit interleaver for interleaving said successive hard decisions in accordance with a bit-interleaving pattern complementary to said bit de-interleaving pattern, thereby generating successive bit-interleaved hard decisions;
an M/H Frame decoder connected for receiving as an input signal thereto said successive bit-interleaved hard decisions and for responding to supply data-randomized transport stream packets; and
a data de-randomizer connected for receiving data-randomized transport stream packets supplied from said M/H Frame decoder and de-randomizing them to supply restored transport stream packets.

31. The claim 20 receiver, further comprising:
a comparator for determining de-interleaved extrinsic information, said comparator being connected to determine said de-interleaved extrinsic information by comparing soft decisions regarding two-bit symbols of M/H-service data encoded with said outer coding as supplied from said symbol de-interleaver with said soft decisions regarding two-bit symbols of M/H-service data encoded with said outer coding as supplied from said outer SISO decoder;
a symbol interleaver connected for receiving said de-interleaved extrinsic information as determined by said comparator and symbol-interleaving successive two-soft-bit symbols of said de-interleaved extrinsic information to generate successive two-soft-bit symbols of symbol-interleaved extrinsic information; and
a second symbol re-coder connected for being addressed by at least successive two-soft-bit data symbol portions of said symbol-interleaved extrinsic information, said second symbol re-coder anti-Gray coding said successive two-soft-bit symbols of said symbol-interleaved extrinsic information to generate successive two-soft-bit symbols of anti-Gray-coded extrinsic information supplied to said inner SISO decoder to modify its operation.

32. The claim 31 receiver, further comprising:
a hard-decision unit connected for generating successive hard decisions as to bits of said M/H-service data responsive to portions of said soft decisions concerning two-bit symbols of said M/H-service data generated by said outer SISO decoder;
an M/H Frame decoder connected for receiving as an input signal thereto said successive hard decisions as to bits of said M/H-service data and for responding to supply data-randomized transport stream packets; and
a data de-randomizer connected for receiving data-randomized transport stream packets supplied from said M/H Frame decoder and de-randomizing them to supply restored transport stream packets.

33. The claim 31 receiver as adapted for receiving M/H-service data that has been bit de-interleaved in accordance with a prescribed bit de-interleaving pattern after having been randomized, but before having been encoded with said outer coding and subjected to symbol interleaving, said receiver further comprising:
a hard-decision unit connected for generating successive hard decisions as to bits of said M/H-service data responsive to portions of said soft decisions concerning two-bit symbols of said M/H-service data generated by said outer SISO decoder;
a bit interleaver for interleaving said successive hard decisions in accordance with a bit-interleaving pattern complementary to said bit de-interleaving pattern, thereby generating successive bit-interleaved hard decisions;
an M/H Frame decoder connected for receiving as an input signal thereto said successive bit-interleaved hard decisions and for responding to supply data-randomized transport stream packets; and
a data de-randomizer connected for receiving data-randomized transport stream packets supplied from said M/H Frame decoder and de-randomizing them to supply restored transport stream packets.

34. The claim 20 receiver, further comprising:
a comparator for determining de-interleaved extrinsic information, said comparator being connected to determine two-soft-bit symbols of said de-interleaved extrinsic information by comparing soft decisions regarding two-bit symbols of M/H-service data encoded with said outer coding as supplied from said symbol de-interleaver with said soft decisions regarding two-bit symbols of M/H-service data encoded with said outer coding as supplied from said outer SISO decoder;
a second symbol re-coder connected for being addressed by two-soft-bit symbols of said de-interleaved extrinsic information, said second symbol re-coder anti-Gray coding each respective two-soft-bit symbol of said de-interleaved extrinsic information to generate a respective two-soft-bit symbol of anti-Gray-coded de-interleaved extrinsic information; and
a symbol interleaver connected for receiving successive said two-bit symbols of anti-Gray-coded de-interleaved extrinsic information and symbol-interleaving successive ones of them to generate symbol-interleaved anti-Gray-coded extrinsic information supplied to said inner SISO decoder to modify its operation.

35. The claim 34 receiver, further comprising:
a hard-decision unit connected for generating successive hard decisions as to bits of said M/H-service data responsive to portions of said soft decisions concerning two-bit symbols of said M/H-service data generated by said outer SISO decoder;
an M/H Frame decoder connected for receiving as an input signal thereto said successive hard decisions as to bits of said M/H-service data and for responding to supply data-randomized transport stream packets; and a data de-randomizer connected for receiving data-randomized transport stream packets supplied from said M/H Frame decoder and de-randomizing them to supply restored transport stream packets.

36. The claim 34 receiver as adapted for receiving M/H-service data that has been bit de-interleaved in accordance with a prescribed bit de-interleaving pattern after having been randomized, but before having been encoded with said outer coding and subjected to symbol interleaving, said receiver further comprising:

a hard-decision unit connected for generating successive hard decisions as to bits of said M/H-service data responsive to portions of said soft decisions concerning two-bit symbols of said M/H-service data generated by said outer SISO decoder;

a bit interleaver for interleaving said successive hard decisions in accordance with a bit-interleaving pattern complementary to said bit de-interleaving pattern, thereby generating successive bit-interleaved hard decisions;

an M/H Frame decoder connected for receiving as an input signal thereto said successive bit-interleaved hard decisions and for responding to supply data-randomized transport stream packets; and a data de-randomizer connected for receiving data-randomized transport stream packets supplied from said M/H Frame decoder and de-randomizing them to supply restored transport stream packets.

* * * * *